(12) United States Patent
Lu et al.

(10) Patent No.: US 9,947,635 B1
(45) Date of Patent: Apr. 17, 2018

(54) SEMICONDUCTOR PACKAGE, INTERPOSER AND SEMICONDUCTOR PROCESS FOR MANUFACTURING THE SAME

(71) Applicant: Advanced Semiconductor Engineering, Inc., Kaohsiung (TW)

(72) Inventors: Wen-Long Lu, Kaohsiung (TW); Yuan-Feng Chiang, Kaohsiung (TW); Chi-Chang Lee, Kaohsiung (TW); Chung-Hsi Wu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/294,594

(22) Filed: Oct. 14, 2016

(51) Int. Cl.
*H01L 23/02* (2006.01)
*H01L 23/00* (2006.01)
*H01L 23/498* (2006.01)

(52) U.S. Cl.
CPC ........ *H01L 24/17* (2013.01); *H01L 23/49811* (2013.01); *H01L 23/49827* (2013.01); *H01L 24/33* (2013.01); *H01L 2224/175* (2013.01); *H01L 2224/1705* (2013.01); *H01L 2224/335* (2013.01); *H01L 2224/33104* (2013.01)

(58) Field of Classification Search
CPC ... H01L 24/17; H01L 24/33; H01L 23/49811; H01L 23/49827; H01L 2224/1703
USPC ........................................................ 257/686
See application file for complete search history.

(56) References Cited

U.S. PATENT DOCUMENTS

| | | | | |
|---|---|---|---|---|
| 5,821,625 A * | 10/1998 | Yoshida | ................ | H01L 21/563 257/659 |
| 5,926,376 A * | 7/1999 | Cho | ....................... | H05K 1/184 257/686 |
| 5,962,924 A * | 10/1999 | Wyland | ................... | H01L 24/81 257/734 |
| 6,153,928 A * | 11/2000 | Cho | ....................... | H01L 23/13 174/260 |
| 7,821,120 B2 * | 10/2010 | Pogge | ............... | H01L 21/76898 257/621 |
| 7,973,416 B2 * | 7/2011 | Chauhan | ............... | H01L 23/481 257/686 |
| 8,456,024 B2 | 6/2013 | Ohnishi et al. | | |
| 8,933,540 B2 * | 1/2015 | Daubenspeck | ......... | H01L 23/34 257/621 |
| 2002/0017710 A1* | 2/2002 | Kurashima | ....... | H01L 21/76898 257/686 |

(Continued)

*Primary Examiner* — Nitin Parekh
(74) *Attorney, Agent, or Firm* — Foley & Lardner LLP; Cliff Z. Liu

(57) ABSTRACT

A semiconductor package includes a first semiconductor device and a second semiconductor device. The first semiconductor device includes a first main body, at least one first columnar portion and at least one first conductive layer. The first columnar portion protrudes from a bottom surface of the first main body. The first conductive layer is disposed on a side surface of the first columnar portion. The second semiconductor device includes a second main body, at least one second columnar portion and at least one second conductive layer. The second columnar portion protrudes from a top surface of the second main body. The second conductive layer is disposed on a side surface of the second columnar portion. The first conductive layer is electrically coupled to the second conductive layer.

20 Claims, 21 Drawing Sheets

(56) References Cited

U.S. PATENT DOCUMENTS

2012/0080696 A1     4/2012   Chan et al.
2012/0241970 A1     9/2012   Ohnishi et al.

* cited by examiner

US 9,947,635 B1

SEMICONDUCTOR PACKAGE, INTERPOSER AND SEMICONDUCTOR PROCESS FOR MANUFACTURING THE SAME

BACKGROUND

1. Field of the Disclosure

The present disclosure relates to a semiconductor package, an interposer and a semiconductor process for manufacturing the same, and more particularly to a semiconductor package, an interposer capable of providing substantially tenon-type interconnections between a plurality of semiconductor devices, and a semiconductor process for manufacturing the same.

2. Description of the Related Art

A conventional semiconductor package may include a semiconductor chip and a substrate or other semiconductor device such as an interposer. The substrate may include a redistribution layer (RDL) and bump pads. The semiconductor chip may include pillars bonded to the bump pads in a chip bonding area of the substrate. The bonding between the pillars and the bump pads may suffer from incomplete joint connection or even bump crack (e.g., intermetallic compound (IMC) crack) due to low tolerance to lateral stress. In particular, in the conventional semiconductor configuration, the quality of the bonding between the pillars and the bump pads is dependent on capability against warpage of the bonding. However, the capability against warpage of conventional bonding between the pillars and the bump pads cannot be significantly improved because the conventional bonding configuration does not provide sufficient lateral stress tolerance.

SUMMARY

In an aspect according to some embodiments, a semiconductor package includes a first semiconductor device and a second semiconductor device. The first semiconductor device includes a first main body, at least one first columnar portion and at least one first conductive layer. The first main body has a bottom surface. The first columnar portion protrudes from the bottom surface of the first main body. The first conductive layer is disposed on a side surface of the first columnar portion. The second semiconductor device includes a second main body, at least one second columnar portion and at least one second conductive layer. The second main body has a top surface facing the bottom surface of the first main body. The second columnar portion protrudes from the top surface of the second main body. The second conductive layer is disposed on a side surface of the second columnar portion. The first conductive layer is electrically coupled to the second conductive layer.

In another aspect according to some embodiments, an interposer includes a main body, at least one conductive via, at least one second columnar portion, at least one first columnar portion, at least one second conductive layer and at least one first conductive layer. The main body has a first surface and a second surface opposite to the first surface. The conductive via is disposed in the main body. The second columnar portion protrudes from the second surface. The first columnar portion protrudes from the first surface. The second conductive layer is disposed on a side surface of the second columnar portion and is electrically coupled to a second end of the conductive via. The first conductive layer is disposed on a side surface of the first columnar portion and is electrically coupled to a first end of the conductive via.

In another aspect according to some embodiments, a semiconductor process includes: (a) providing a main body; (b) forming at least one columnar portion protruding from the main body; and (c) forming at least one conductive layer on a side surface of the columnar portion to form a semiconductor device.

DETAILED DESCRIPTION

Embodiments of the present disclosure provide an improved semiconductor package structure allowing for increased lateral stress tolerance of pillars and bump pads of a semiconductor package.

A semiconductor package may comprise a semiconductor chip and a substrate. Pillars of the semiconductor chip may be bonded to bump pads of the substrate, and each bump pad in the substrate may correspond to a corresponding pillar in the semiconductor chip. To avoid deformations caused by warpage, the bonding between the pillars and the bump pads should tolerate against a lateral stress resulting from thermal stress caused by heating or temperature variations. If the strength of the bonding between the pillars and the bump pads is not sufficient to tolerate against the lateral stress caused by heating or temperature variations, the pillars and the bump pads may incur warpage. When the warpage occurs, the pillars and/or the bump pads may suffer from deformations. This may lead to incomplete joint connection between the pillars and the bump pads or even bump crack (e.g., IMC crack). To address such concerns, the bonding between the pillars and the bump pads may be designed to have larger contact areas between the pillars and bump pads or by enhancing material strengths of the pillars and bump pads. However, such designs or configurations may significantly increase the manufacturing cost of the semiconductor package and the footprint area for the pillars and bump pads.

To address the above concerns, an improved structure is formed that provides higher lateral stress tolerance and more compact sizes of pillars and bump pads, through improved pillar structure and bump pad structure. The techniques described can be beneficial to yield circuitry with improved performance and to yield a semiconductor package of lower manufacturing cost.

In some embodiments, the improved pillars and/or bump pads provide substantially tenon-type connections between the pillars and/or bump pads. Such configuration may significantly reduce stress components of a thermal stress in a direction perpendicular a contacting face between a pillar and a bump pad and may eliminate stress components of the thermal stress in a direction parallel to the contacting face by tenon-type connections. The lateral stress tolerance may be increased and thus a size of the pillars and bump pads can be smaller, thereby yielding a more compact semiconductor package.

Figure 1:
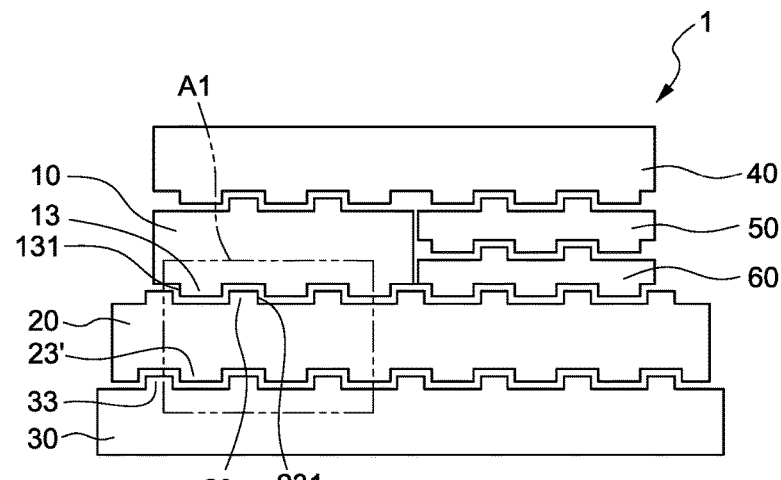
FIG. 1 illustrates an example of a semiconductor package according to some embodiments of the present disclosure.

FIG. 1 illustrates an example of a semiconductor package 1 according to some embodiments of the present disclosure. The semiconductor package 1 comprises a first semiconductor device 10, a second semiconductor device 20, a third semiconductor device 30, a fourth semiconductor device 40, a fifth semiconductor device 50 and a sixth semiconductor device 60. The first semiconductor device 10 is electrically coupled to the second semiconductor device 20. The second semiconductor device 20 is electrically coupled to the third semiconductor device 30. The fourth semiconductor device 40 is electrically coupled to the first semiconductor device 10 and the fifth semiconductor device 50. The sixth semiconductor device 60 is electrically coupled to the second semiconductor device 20 and the fifth semiconductor device 50. In some embodiments, the first semiconductor device 10, the fourth semiconductor device 40, the fifth semiconductor device 50 and the sixth semiconductor device 60 are application specific integrated circuits (ASICs), the second semiconductor device 20 is an interposer, and the third semiconductor device 30 is a substrate.

As shown in FIG. 1, joint connections between the semiconductor devices 10, 20, 30, 40, 50 and 60 are substantially tenon-type connections. Each of the semiconductor devices 10, 20, 30, 40, 50 and 60 comprises one or more columnar portions (e.g., the first semiconductor device 10 comprises a plurality of first columnar portions 13, and the second semiconductor device 20 comprises a plurality of second columnar portions 23 in a region A1). In some embodiments of the present disclosure, at least one first conductive layer 14 (FIG. 2A) is disposed on a side surface 131 of the first columnar portion 13 and/or at least one second conductive layer 24 (FIG. 2A) is disposed on a side surface 231 of the second columnar portion 23. The first conductive layer 14 of the first columnar portion 13 is electrically bonded to the second conductive layer 24 of the columnar portion 23 to form an interconnection structure 16. In some embodiments of the present disclosure, at least one bottom conductive layer 24' (FIG. 2A) is disposed on a side surface of a bottom columnar portion 23' and/or at least one third conductive layer 34 (FIG. 2A) is disposed on a side surface 331 of a third columnar portion 33. The bottom conductive layer 24' of the bottom columnar portion 23' is electrically bonded to the third conductive layer 34 of the third columnar portions 33 to form an interconnection structure 26.

Figure 2A:
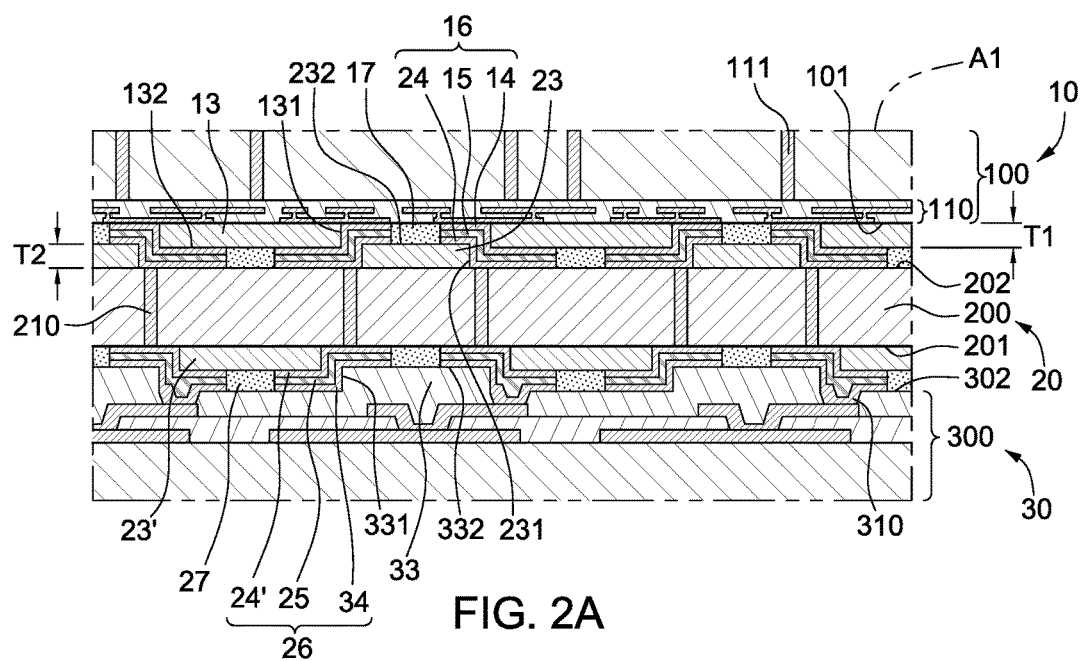
FIG. 2A illustrates an enlarged cross-sectional view of a region A1 shown in FIG. 1 according to some embodiments of the present disclosure.

FIG. 2A illustrates an enlarged cross-sectional view of the region A1 shown in FIG. 1 according to some embodiments of the present disclosure. In one or more embodiments, the second semiconductor device 20 is an interposer that electrically connects the third semiconductor device 30 (e.g., a substrate) and the first semiconductor device 10 (e.g., an ASIC). The first semiconductor device 10 includes a first main body 100, at least one first columnar portion 13 and at least one first conductive layer 14. The first main body 100 has a first surface 101 (e.g., a bottom surface), and the first columnar portion 13 protrudes from the first surface 101. The first columnar portion 13 has a side surface 131 and a bottom surface 132. The first conductive layer 14 is disposed on the side surface 131 of the first columnar portion 13. In some embodiments, the first conductive layer 14 further extends to the bottom surface 132 of the first columnar portion 13 and the first surface 101 of the first main body 100. A similar configuration can be implemented for additional first columnar portions 13 and additional first conductive layers 14.

The second semiconductor device 20 includes a second main body 200, at least one second columnar portion 23 and at least one second conductive layer 24. The second main body 200 has a second surface 202 (e.g., a top surface) facing the first surface 101 of the first main body 100. The second columnar portion 23 protrudes from the second surface 202. The second columnar portion 23 has a side surface 231 and a top surface 232. The second conductive layer 24 is disposed on the side surface 231 of the second columnar portion 23. In some embodiments, the second conductive layer 24 further extends to the top surface 232 of the second columnar portion 23 and the second surface 202 of the second main body 200. A similar configuration can be implemented for additional second columnar portions 23 and additional second conductive layers 24. Additionally, the first conductive layer 14 is electrically coupled to the corresponding second conductive layer 24. In one or more embodiments, a bonding material 15 is disposed between the first conductive layer 14 on the first columnar portion 13 and the second conductive layer 24 on the second columnar portion 23 so as to form an interconnection structure 16. That is, the first conductive layer 14 is electrically connected to the second conductive layer 24 through the bonding material 15. For example, the bonding material 15 may be an anisotropic conductive film (ACF), an anisotropic conductive adhesive (ACA), an anisotropic conductive paste (ACP) or solder. Further, an isolation material 17 may be disposed between the interconnection structures 16. In other words, the interconnection structures 16 are isolated from each other by the isolation material 17. However, it is noted that the bonding material 15 may be omitted in some embodiments, that is, the first conductive layer 14 may directly contact the second conductive layer 24. In addition, the isolation material 17 may also be omitted in some embodiments.

As shown in FIG. 2A, the first columnar portions 13 have substantially the same height (a first height T1), and the second columnar portions 23 have substantially the same height (a second height T2), and T1 and T2 can be the same or different. In some embodiments, a sum of the first height T1 of the first columnar portion 13 and the second height T2 of the second columnar portions 23 is greater than a distance between the first surface 101 of the first main body 100 and the second surface 202 of the second main body 200. In such configuration, each first columnar portion 13 at least partially extends into a gap between two corresponding adjacent second columnar portions 23, and each second columnar portion 23 at least partially extends into a gap between two corresponding adjacent first columnar portions 13. In one or more embodiments, the first columnar portions 13 may have different heights, and the second columnar portions 23 may have different heights. However, in such configuration, the sum of the height of any first columnar portion 13 and the height of the corresponding second columnar portion 23 is still greater than the distance between the first surface 101 of the first main body 100 and the second surface 202 of the second main body 200.

In the embodiments illustrated in FIG. 2A, the first columnar portion 13 is formed of, or includes, a material that is different from a material of the first main body 100, and the second columnar portion 23 is formed of, or includes, a material that is different from a material of the second main body 200. However, in other embodiments, the first columnar portion 13 is formed of a same material as that of the first main body 100, and the second columnar portion 23 is formed of a same material as that of the second main body 200.

As illustrated in FIG. 2A, the first semiconductor device 10 further comprises a first conductive element 110. The first conductive element 110 is disposed within the first main body 100 and is exposed from the first surface 101. The first conductive element 110 may include at least one redistribution layer (RDL) and at least one via 111. The first conductive layer 14 electrically connects or physically contacts the first conductive element 110. In some embodiments of the present disclosure, the first conductive element 110 is disposed on the first surface 101 of the first main body 100. In such configuration, the first columnar portion 13 is disposed on the first conductive element 110, and the first conductive layer 14 electrically connects or physically contacts the first conductive element 110.

As illustrated in FIG. 2A, the second semiconductor device 20 further includes a second conductive element 210. The second conductive element 210 is disposed within the second main body 200 and is exposed from the second surface 202. The second conductive element 210 may include at least one via. The second conductive layer 24 electrically connects or physically contacts the second conductive element 210. In some embodiments of the present disclosure, the second conductive element 210 is disposed on the second surface 202 of the second main body 200. In such configuration, the second columnar portion 23 is disposed on the second surface 202 of the second main body 200 and electrically connects or physically contacts the second conductive element 210, the second conductive layer 24 is disposed on the second surface 202 of the second main body 200 and electrically connects or physically contacts the second conductive element 210, and the second main body 200 may comprise at least one via therewithin. The at least one via within the second main body 200 electrically connects or physically contacts the second conductive element 210 at the second surface 202 of the second main body 200.

As illustrated in FIG. 2A, the portion of the first conductive layer 14 disposed on the side surface 131 electrically connects or physically contacts the portion of the second conductive layer 24 disposed on the side surface 231. The portion of the first conductive layer 14 disposed on the bottom surface 132 of the first columnar portion 13 electrically connects or physically contacts the portion of the second conductive layer 24 disposed on the second surface 202 of the second main body 200. Alternatively, or in conjunction, the portion of the second conductive layer 24 disposed on the top surface 232 of the second columnar portion 23 may electrically connect or physically contact the portion of the first conductive layer 14 disposed on the first surface 101 of the first main body 100.

As shown in FIG. 2A, the first columnar portion 13 and the second columnar portion 23 have a rectangular shape (e.g., from a cross-sectional view and/or a top view). In some embodiments of the present disclosure, the first and second columnar portions 13, 23 may have a tapered shape. In other embodiments of the present disclosure, the first and second columnar portions 13, 23 may have a cylindrical shape. In particular, variously shaped columnar bodies may be used as the first and second columnar portions 13, 23. In other embodiments of the present disclosure, the first and second columnar portions 13, 23 may be columnar portions having different shapes.

The third semiconductor device 30 is disposed below the second semiconductor device 20, and includes a third main body 300, at least one third columnar portion 33, at least one third conductive layer 34 and a third conductive element 310. The third main body 300 has a second surface 302 (e.g., a top surface), and the third columnar portion 33 protrudes from the second surface 302 of the third main body 300. The third columnar portion 33 has a side surface 331 and a top surface 332. The third conductive layer 34 is disposed on the side surface 331 of the third columnar portion 33. In some embodiments, the third conductive layer 34 further extends to the top surface 332 of the third columnar portion 33 and the second surface 302 of the third main body 300. The third conductive element 310 may be disposed on the second surface 302. The third columnar portion 33 may be disposed on the third conductive element 310. A similar configuration can be implemented for additional third columnar portions 33 and additional third conductive layers 34.

The third conductive element 310 may include at least one RDL and at least one via for establishing interconnection between the third main body 300 and the third conductive layer 34 on the third columnar portion 33. The third conductive element 310 may be disposed within the third main body 300 and is exposed from the second surface 302. The third conductive layer 34 electrically connects or physically contacts the third conductive element 310. In some embodiments of the present disclosure, the third conductive element 310 is disposed on the second surface 302 of the third main body 300.

As shown in FIG. 2A, the second main body 200 further includes a first surface 201 (e.g., a bottom surface) opposite to the second surface 202 and facing the second surface 302 of the third main body 300. The second semiconductor device 20 further includes at least one bottom columnar portion 23' protruding from the first surface 201 of the second main body 200. At least one bottom conductive layer 24' is disposed on a side surface of the bottom columnar portion 23', and further extends to a bottom surface of the bottom columnar portion 23' and the first surface 201 of the second main body 200. The bottom conductive layer 24' is electrically coupled to the corresponding third conductive layer 34 to form an interconnection structure 26 similar to the interconnection structure 16. In one or more embodiments, a bonding material 25 is disposed between the bottom conductive layer 24' on the bottom columnar portion 23' and the third conductive layer 34 on the third columnar portion 33 so as to form the interconnection structure 26. That is, the bottom conductive layer 24' is electrically connected to the third conductive layer 34 through the bonding material 25. For example, the bonding material 25 may be an ACF, an ACA, an ACP or solder. Further, an isolation material 27 may be disposed between the interconnection structures 26. In other words, the interconnection structures 26 are isolated from each other by the isolation material 27. However, it is noted that the bonding material 25 may be omitted in some embodiments, that is, the bottom conductive layer 24' may directly contact the third conductive layer 34. In addition, the isolation material 27 may also be omitted in some embodiments.

In some embodiments of the present disclosure, the second conductive element 210 includes a through via that penetrates through the second main body 200 to electrically connect the bottom conductive layer 24' and the second conductive layer 24. As shown in FIG. 2A, the first conductive element 110 within the first main body 100 of the first semiconductor device 10 is electrically connected with the third conductive element 310 within the third main body 300 of the third semiconductor device 30 through the first conductive layer 14, the second conductive layer 24, the second conductive element 210, the bottom conductive layer 24' and the third conductive layer 34.

In some embodiments of the present disclosure, the bottom columnar portions 23' may have substantially the same height, and the third columnar portions 33 may have substantially the same height. In some embodiments, a sum of the height of the bottom columnar portion 23' and the height of the third columnar portion 33 is greater than a distance between the first surface 201 of the second main body 200 and the second surface 302 of the third main body 300. In such configuration, each bottom columnar portion 23' at least partially extends into a gap between two corresponding adjacent third columnar portions 33, and each third columnar portion 33 at least partially extends into a gap between two corresponding adjacent bottom columnar portions 23'. In some embodiments of the present disclosure, the bottom columnar portions 23' may have different heights, and the third columnar portions 33 may have different heights. However, in such configuration, the sum of the height of any bottom columnar portion 23' and the height of the corresponding third columnar portion 33 is greater than the distance between the first surface 201 of the second main body 200 and the second surface 302 of the third main body 300.

In some embodiments of the present embodiment, the third columnar portion 33 is formed of, or includes, a material that is the same as or different from a material of the third main body 300. The second columnar portion 23 is formed of, or includes, a material that is the same as or different from a material of the bottom columnar portions 23'.

As shown in FIG. 2A, the bottom columnar portions 23' and the third columnar portions 33 have a rectangular shape. In some embodiments of the present disclosure, the bottom and third columnar portions 23' and 33 have a tapered shape. In other embodiments of the present disclosure, the bottom and third columnar portions 23' and 33 have a cylindrical shape. In particular, variously shaped columnar bodies may be used as the bottom and third columnar portions 23' and 33. In other embodiments of the present disclosure, the bottom and third columnar portions 23' and 33 may be columnar portions having different shapes.

Figure 2B:
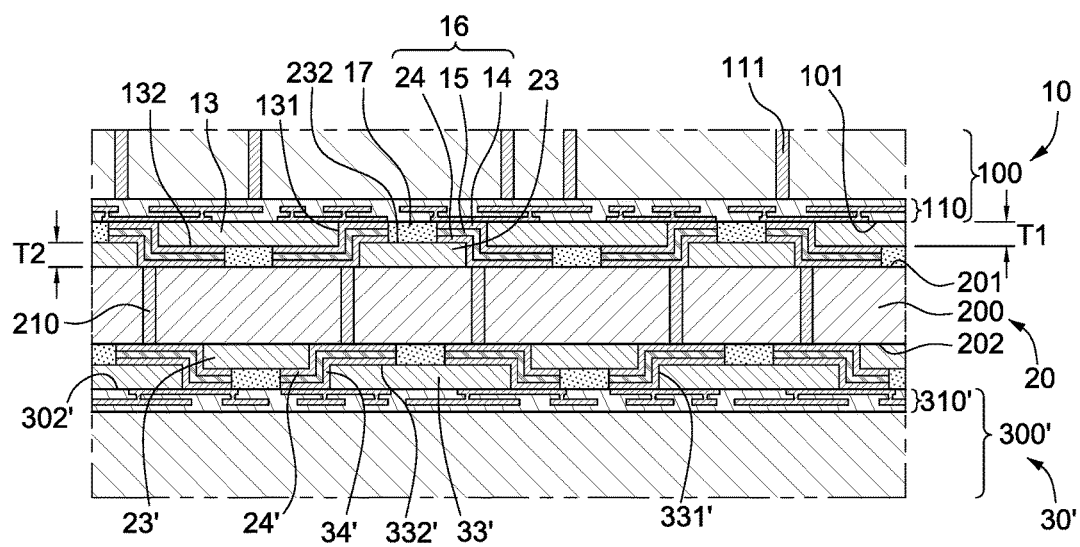
FIG. 2B illustrates an enlarged cross-sectional view of a region of FIG. 1 according to some embodiments of the present disclosure.

FIG. 2B illustrates an enlarged cross-sectional view of the region A1 shown in FIG. 1 according to other embodiments of the present disclosure. As shown in FIG. 2B, a semiconductor package is similar to that of FIG. 2A except that the third semiconductor device 30 is replaced with a third semiconductor device 30'.

As shown in FIG. 2B, the third semiconductor device 30' is an ASIC and includes a third conductive element 310'. The third conductive element 310' is disposed within a third main body 300' and is exposed from a second surface 302' of the third main body 300'. The third conductive element 310' may include at least one RDL and at least one via. A third conductive layer 34' electrically connects or physically contacts the third conductive element 310'. In such a configuration, a third columnar portion 33' is disposed on the third conductive element 310'.

In the embodiments illustrated in FIG. 2B, a portion of the third conductive layer 34' disposed on a side surface 331' electrically connects or physically contacts a portion of the bottom conductive layer 24' disposed on a side surface of the bottom columnar portion 23'. The portion of the third conductive layer 34' disposed on a top surface 332' of the third columnar portion 33' may electrically connect or physically contact a portion of the bottom conductive layer 24' disposed on the second surface 202 of the second main body 200. Alternatively, or in conjunction, the portion of the bottom conductive layer 24' disposed on the bottom surface of the bottom columnar portion 23' may electrically connect or physically contact the portion of the third conductive layer 34' disposed on the second surface 302' of the third main body 300'.

The third conductive element 310' may include one or more vias, one or more bump pads for establishing interconnections between the third main body 300' and the third conductive layer 34'.

In some embodiments of the present disclosure, as also shown in FIG. 2B, the first conductive element 110 formed within the first main body 100 of the first semiconductor device 10 is electrically connected with the third conductive element 310' through the first conductive layer 14 electrically connected with the second conductive layer 24, the second conductive element 210 electrically connected with the second and bottom conductive layers 24 and 24', and the third conductive layer 34' electrically connected with the bottom conductive layer 24'.

In the embodiments shown in FIG. 2B, the bottom columnar portions 23' may have substantially the same height, and the third columnar portions 33' may have substantially the same height. In some embodiments, a sum of the height of the bottom columnar portion 23' and the height of the third columnar portion 33' is greater than a distance between the second surface 202 of the second main body 200 and the second surface 302' of the third main body 300'. In some embodiments of the present disclosure, the bottom columnar portions 23' may have different heights, and the third columnar portions 33' may have different heights. However, in such configuration, the sum of the height of any bottom columnar portion 23' and the height of the corresponding third columnar portion 33' is still greater than the distance between the second surface 202 of the second main body 200 and the second surface 302' of the third main body 300'.

In some embodiments of the present embodiment, the third columnar portion 33' is formed of, or includes, a material that is the same as a material of the third main body 300'. In other embodiments of the present disclosure, the third columnar portion 33' is formed of, or includes, a material that is different from a material of the third main body 300'.

Figure 3:
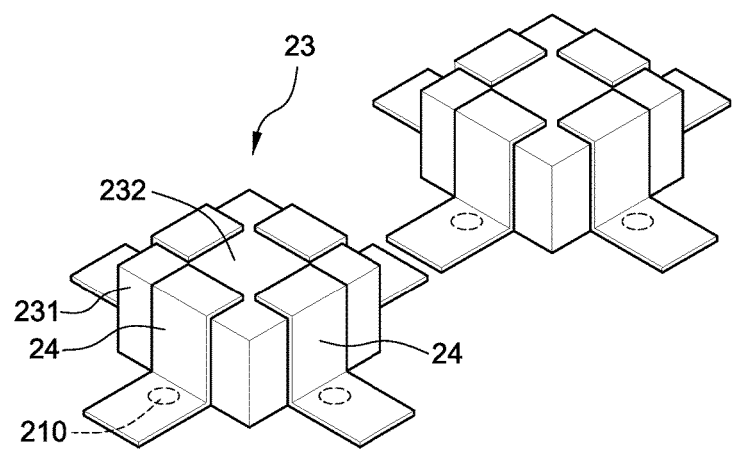
FIG. 3 illustrates a perspective view of two adjacent second columnar portions of a second semiconductor device of the semiconductor package shown in FIGS. 1, 2A and 2B.

FIG. 3 illustrates a perspective view of two adjacent second columnar portions 23 of the second semiconductor device 20 of the semiconductor package 1 shown in FIGS. 1, 2A and 2B. As shown in FIG. 3, for each of the second columnar portions 23, there are four second conductive layers 24 disposed on four lateral side surfaces 231 of the second columnar portion 23, respectively, and further extend to the top surface 232 of the second columnar portion 23. It is noted that the four second conductive layers 24 do not physically contact each other, and thus each second columnar portion 23 can transmit four different signals. Therefore, an input/output (I/O) count of the second semiconductor device 20 is greater than an I/O count of a typical bonding between pillars and bump pads. It is noted that a number of conductive layers 24 disposed on each second columnar portion 23 can be varied from that shown in FIG. 3, and more generally can be one, two, or more than two. It is noted that a perspective view of the first columnar portions 13, the bottom columnar portions 23' and the third columnar portions 33 (or 33') may be similar to the perspective view of the second columnar portions 23.

In some embodiments of the present disclosure, the heights of the columnar portions 13, 23, 23', 33, 33' are about half of typical heights of copper pillars. This may lead to an overall thickness of the semiconductor package 1 being significantly reduced. Additionally, compared with typical copper pillars (one pillar for one signal), each of the columnar portions 13, 23, 23', 33, 33' of some embodiments the present disclosure can be used to transmit multiple (e.g., at least four) different signals. Given the above, the tenon-type structure of some embodiments of the present disclosure may largely increase the complexity of signals distribution and yield a more compact semiconductor package 1.

In addition, some embodiments of the present disclosure provide sufficient lateral stress tolerance to significantly improve capability against warpage of bonding between two or more semiconductor devices in a semiconductor package. In particular, some embodiments of the present disclosure provide an improved semiconductor package structure providing higher lateral stress tolerance and more compact sizes of pillars and bump pads, through improved pillar structure and bump pad structure.

Figure 4:
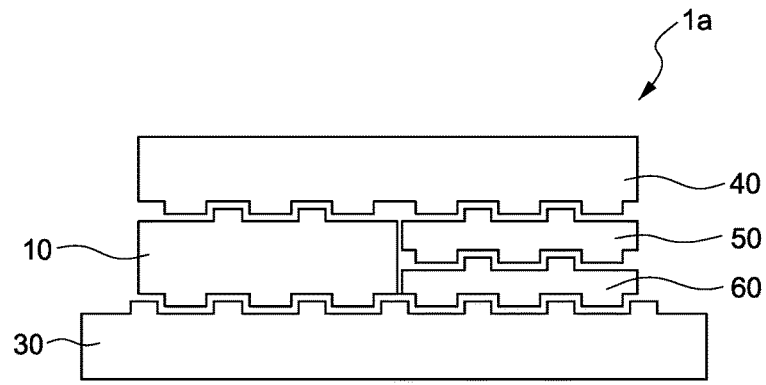
FIG. 4 illustrates an example of a semiconductor package according to some embodiments of the present disclosure.

FIG. 4 illustrates an example of a semiconductor package 1a according to some embodiments of the present disclosure. The semiconductor package 1a of FIG. 4 is similar to the semiconductor package 1 as shown in FIG. 1, except that the second semiconductor device 20 (e.g., an interposer) is omitted. Therefore, the first semiconductor device 10 (e.g., an ASIC) and the sixth semiconductor device 60 (e.g., an ASIC) are electrically connected to the third semiconductor device 30 (e.g., a substrate).

Figure 5A:
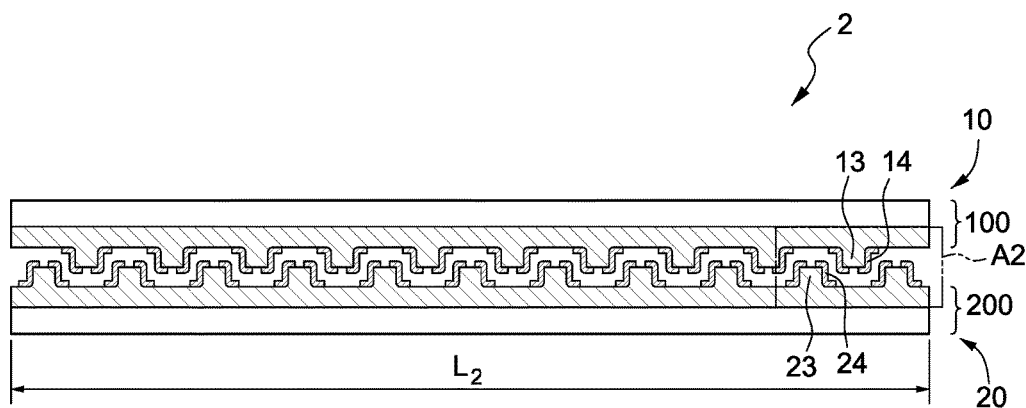
FIG. 5A illustrates an example of a semiconductor package before being heated according to some embodiments of the present disclosure.
Figure 5B:
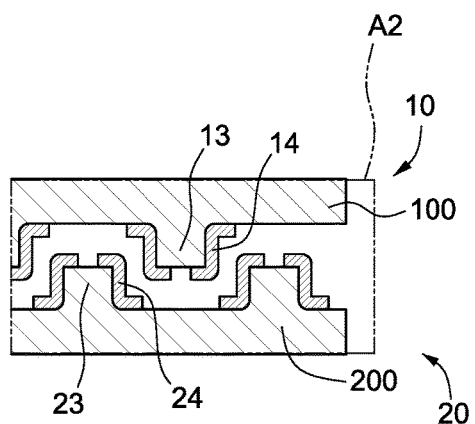
FIG. 5B illustrates an enlarged cross-sectional view of a region A2 shown in FIG. 5A.

FIG. 5A illustrates an example of a semiconductor package 2 before being heated. FIG. 5B illustrates an enlarged cross-sectional view of a region A2 shown in FIG. 5A. The semiconductor package 2 may include a first semiconductor device 10 and a second semiconductor device 20. The first semiconductor device 10 includes a first main body 100 and at least one first columnar portion 13 with the first conductive layer 14 bonded thereon. The second semiconductor device 20 includes a second main body 200 and at least one second columnar portion 23 with the second conductive layer 24 bonded thereon. The second main body 200 has a second length $L_2$.

Figure 5C:
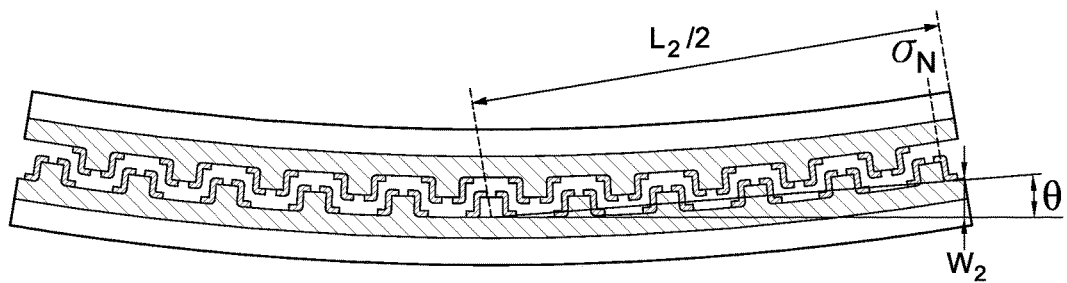
FIG. 5C illustrates an example of deformation of the semiconductor package if warpage occurs after being heated.
Figure 5D:
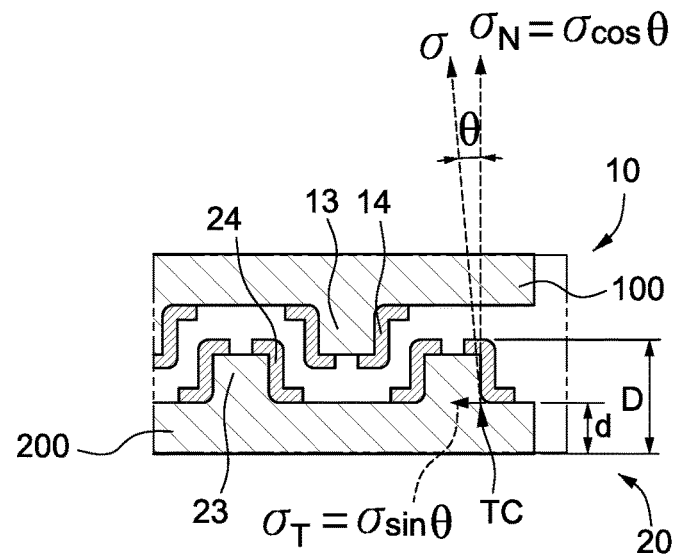
FIG. 5D illustrates an example of force distribution on a second semiconductor device when warpage does not occur.

FIG. 5C illustrates an example of deformation of the semiconductor package 2 if warpage occurs after being heated. FIG. 5D illustrates an example of force distribution on the second semiconductor device 20 when the warpage does not occur. Referring to FIG. 5C, when the semiconductor package 2 is heated, the warpage of the semiconductor package 2 may occur due to a thermal stress ($\sigma$) occurring at a tenon corner (point TC; see FIG. 5D) of the second semiconductor device 20. The thermal stress ($\sigma$) occurring at the point TC can be expressed as below:

$$\sigma = (\alpha_T - \alpha_B) \cdot \Delta T \cdot E_T \cdot E_B \cdot A_T / (E_T \cdot A_T + E_B \cdot A_B) \quad (1)$$

where $\alpha_T$ and $\alpha_B$ are coefficients of thermal expansion (CTE) for the second columnar portion 23 and the second conductive layer 24, respectively, $E_T$ and $E_B$ are coefficients of Young's modulus for the second columnar portion 23 and the second conductive layer 24, respectively, $\Delta T$ is a temperature difference between a temperature before the semiconductor package 2 being heated (FIG. 5A) and a temperature after the semiconductor package 2 being heated (FIG. 5C), and $A_T$ and $A_B$ are cross-sectional areas of the second columnar portion 23 and the second conductive layer 24, respectively, in the semiconductor package 2 along a vertical direction. That is, $A_T$ is an entire area of the lateral side surfaces 231 of the second columnar portion 23, and $A_B$ is an entire surface area of the second conductive layer 24 that is disposed on the lateral side surface 231.

Referring to FIG. 5D, the warpage of the second semiconductor device 20 does not actually occur, and the thermal stress ($\sigma$) occurs at the point TC of the semiconductor package 2. That is, the second columnar portion 23 sustains the thermal stress ($\sigma$). The inclination $\theta$ is between the direction of the thermal stress ($\sigma$) and the vertical direction (e.g., y direction), where $\theta$ is the warpage angle. The tangent components ($\sigma_T$) and normal component ($\sigma_N$) of the thermal stress ($\sigma$) may be expressed as below:

$$\sigma_T = \sigma \cdot \sin \theta, \text{ and}$$

$$\sigma_N = \sigma \cdot \cos \theta \quad (2)$$

From equations 1 and 2, it can be understood that a semiconductor device with tenon-type interconnections may tolerate larger warpage when suffering from a same thermal stress.

Referring to FIG. 5C, the thermal stress ($\sigma$) occurs at the direction perpendicular to a radial direction of a warpage curve of the semiconductor package 2. The relationship of the warpage ($W_2$), the second length ($L_2$) of the second semiconductor device 20 and warpage angle ($\theta$) can be expressed as below:

$$W_2 \cong (L_2/2)\cdot \sin\theta \quad (3).$$

The tangent component ($\sigma_T$) and normal component ($\sigma_N$) of the thermal stress ($\sigma$) should satisfy the following:

$$K_t\cdot\sigma_T = K_t\cdot\sigma\cdot\sin\theta \leq S_T, \quad (4)$$

$$\sigma_N = \sigma\cdot\cos\theta \leq S_B \quad (5)$$

where $K_t$ is the stress concentration factor at the corner between the second main body 200 and the second columnar portion 23 (at the point TC),
$S_T$ is a material strength of the second columnar portion 23, and
$S_B$ is a material strength of the second conductive layer 24.

According to principles of stress theory, the stress concentration factor $K_t$ in equation (4) will be greater than about 1.2, or less than about 3.0, or in a range between about 1.4 and about 3.0, for D>d, and r/d between about 0.02 and about 0.35 for the second semiconductor device 20 of FIGS. 5B and 5D, where D is the thickness of the second semiconductor device 20, d is the thickness of the second main body 200, and r is the radius of the second columnar portion 23 at the point TC.

Substituting $\theta$ of equation (4) into equation (3) results in equation (6) to solve for $W_2$. In addition, substituting $\theta$ of equation (5) into equation (3) results in equation (7) to solve for $W_2$. Thus, the warpage $W_2$ of the second main body 200 satisfies at least one of the following equations.

$$W_2 \leq (L_2/2)\cdot\sin[S_T/(K_t\sigma)] \quad (6)$$

$$W_2 \leq (L_2/2)\cdot\sin[\cos^{-1}(S_B/\sigma)] \quad (7)$$

For optimization design (e.g., process control on temperature, a material for the second columnar portion 23, a structure with reduced concentration factor, and so forth), equations (6) and (7) can be used to determine an estimation (e.g., a design rule) of the warpage $W_2$ to the semiconductor package 2. For an example on an 12" wafer, the warpage of 2 mm at $\theta=0.76°$ (from calculation) is accepted (good electrical connection) and is greater than 1.5 mm (actual measured result and results in failed electrical connection) at $\theta=0.57°$ of a typical comparison structure. The difference between the structure with and without tenon is more noticeable when the warpage increases.

Similarly, for example, for the first semiconductor device 10, the first main body 100 may have a first length $L_1$, the first conductive layer 14 may have a material strength $S_B$, and the first columnar portion 13 may have a material strength $S_T$. When a warpage $W_1$ of the first main body 100 occurs, the warpage $W_1$ may satisfy at least one of the following equations (8) and (9):

$$W_1 \leq (L_1/2)\cdot\sin[S_T/(K_t\sigma)] \quad (8)$$

$$W_1 \leq (L_1/2)\cdot\sin[\cos^{-1}(S_B/\sigma)] \quad (9)$$

where $K_t$ is a stress concentration factor at a corner between the first main body 100 and the first columnar portion 13, and where $\sigma$ is a thermal stress at the corner.

For equations (8) and (9), it should be noted that the warpage $W_1$ of the first main body 100 would be restricted by the first length $L_1$ of first main body 100, the thermal stress $\sigma$ at the corner between the first main body 100 and the first columnar portion 13, the material strength $S_B$ of first conductive layer 14 and the material strength $S_T$ of first columnar portion 13. In particular, a lower first length $L_1$ or a lower thermal stress $\sigma$ may yield a lower warpage $W_1$.

The criterion mentioned above may also be applicable to semiconductor devices 30, 40, 50, 60 (FIG. 1) because the semiconductor devices 30, 40, 50, 60 may have similar columnar portions (tenon-type interconnections) as the semiconductor devices 10, 20.

Figure 6:
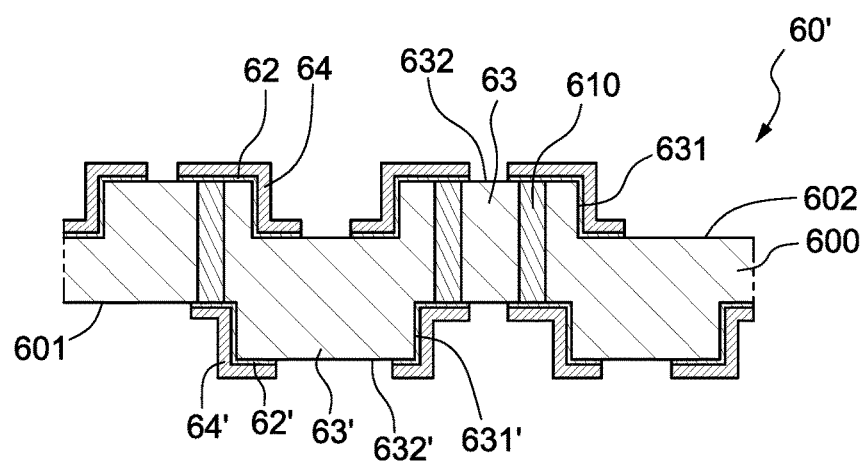
FIG. 6 illustrates a cross-sectional view of an interposer according to some embodiments of the present disclosure.

FIG. 6 illustrates a cross-sectional view of an interposer 60' according to some embodiments of the present disclosure. In some embodiments of the present disclosure, the interposer 60' may be used as the semiconductor device 10, 20, 50 or 60 (FIG. 1). The interposer 60' may have a similar structure as the interposer 20 shown in FIGS. 2A and 2B. A difference between the interposer 60' and the interposer 20 is that second columnar portions 63 and bottom columnar portions 63' are formed of a same material as that of a main body 600 of the interposer 60'.

In some embodiments, a seed layer 62 is formed on a top surface 632 and a side surface 631 of each second columnar portion 63, and a seed layer 62' is formed on a bottom surface 632' and a side surface 631' of each bottom columnar portion 63'. The seed layers 62 and 62' may extend to surfaces 602, 601 of the main body 600, respectively. In some embodiments, a conductive layer 64 is formed on the seed layer 62, and a conductive layer 64' is formed on the seed layer 62'. As shown in FIG. 6, at least one conductive element 610 (such as a through via) is formed to penetrate through the main body 600 and the second columnar portion 63 so as to electrically connect the conductive layer 64 and the conductive layer 64'.

Figure 7:
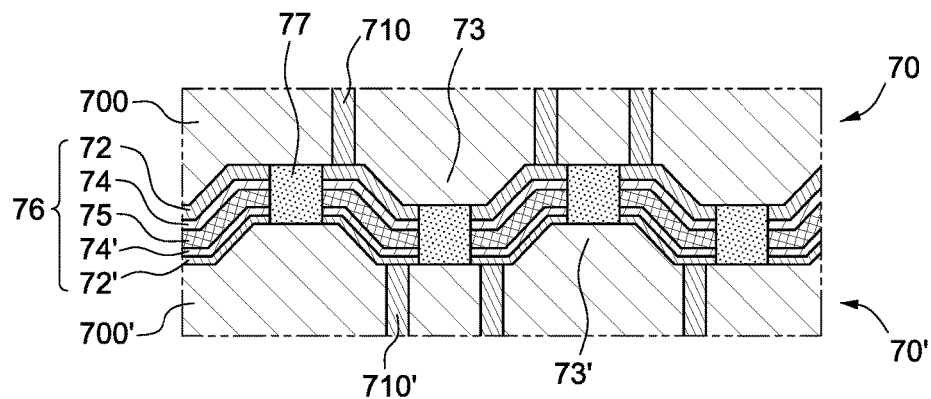
FIG. 7 illustrates interconnection structures between two semiconductor devices according to some embodiments of the present disclosure.

FIG. 7 illustrates interconnection structures 76 between two semiconductor devices 70 and 70' according to some embodiments of the present disclosure. The semiconductor device 70 includes a main body 700, columnar portions 73 and at least one via 710. Each of the columnar portions 73 protrudes from the main body 700, and has a tapered shape. A seed layer 72 is formed on a side surface and a bottom surface of each columnar portion 73, and on a bottom surface of the main body 700 of the semiconductor device 70. A conductive layer 74 is formed on the seed layer 72. In the embodiments shown in FIG. 7, the seed layer 72 and the conductive layer 74 are jointly divided into a plurality of segments by isolation elements 77. The via 710 extends within the main body 700 of the semiconductor device 70 and is electrically connected to the seed layer 72.

Similarly, as shown in FIG. 7, the semiconductor device 70' includes a main body 700', columnar portions 73' and at least one via 710' extending within the semiconductor device 70'. A seed layer 72' is formed on a side surface and a top surface of each columnar portion 73', and on a top surface of the main body 700' of the semiconductor device 70'. A conductive layer 74' is formed on the seed layer 72'. The seed layer 72' and the conductive layer 74' are jointly divided into a plurality of segments by the isolation elements 77. The isolation elements 77 are formed of, for example, a non-conductive film (NCF) or a non-conductive paste (NCP).

In some embodiments of the present disclosure, the conductive layer 74 of the semiconductor device 70 is electrically connected with the conductive layer 74' of the semiconductor device 70' through a bonding layer 75 so as to form the interconnection structure 76. The bonding layer 75 is solder, for example. The isolation elements 77 may be disposed between the interconnection structures 76. In other words, the interconnection structures 76 are isolated from each other by the isolation elements 77. It should be noted that, in the embodiments shown in FIG. 7, the columnar portions 73 and 73' are tapered in shape (e.g., a trapezoidal shape). In other embodiments of the present disclosure, the columnar portions 73 and 73' may have a cylindrical shape. Variously shaped columnar bodies may be used as the columnar portions 73 and 73'. In other embodiments of the present disclosure, the columnar portions 73 and 73' may be columnar portions having different shapes.

Figure 8:
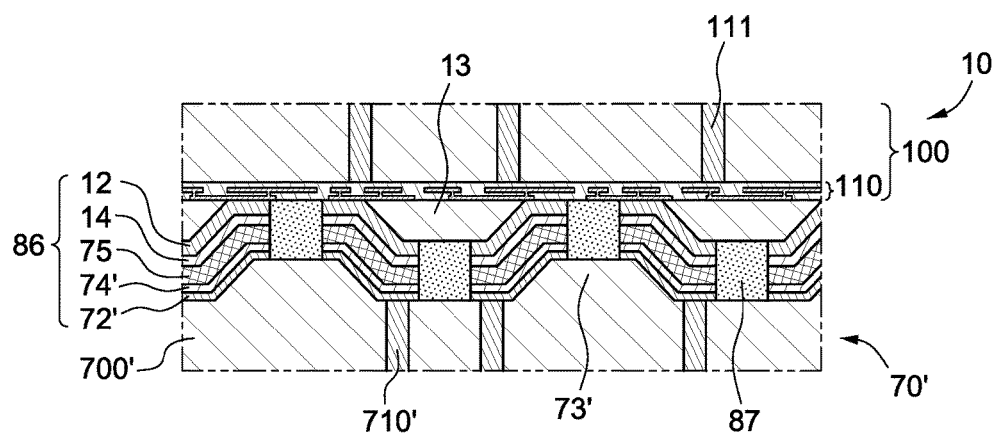
FIG. 8 illustrates interconnection structures between two semiconductor devices according to some embodiments of the present disclosure.

FIG. 8 illustrates interconnection structures 86 between two semiconductor devices 10 and 70' according to some embodiments of the present disclosure. The arrangement shown in FIG. 8 is similar to that of FIG. 7. A difference between the arrangements of FIGS. 7 and 8 is that the semiconductor device 70 is replaced by the semiconductor device 10. The semiconductor device 10 of FIG. 8 is similar to the semiconductor device 10 of FIG. 1, except that the first columnar portion 13 is tapered in shape (e.g., a trapezoidal shape) and a seed layer 12 is disposed between the first conductive layer 14 and the first columnar portion 13, and between the first conductive layer 14 and the first main body 100. Another difference between the arrangements of FIGS. 7 and 8 is that isolation elements 87 are formed of a capillary underfill (CUF).

Figure 9:
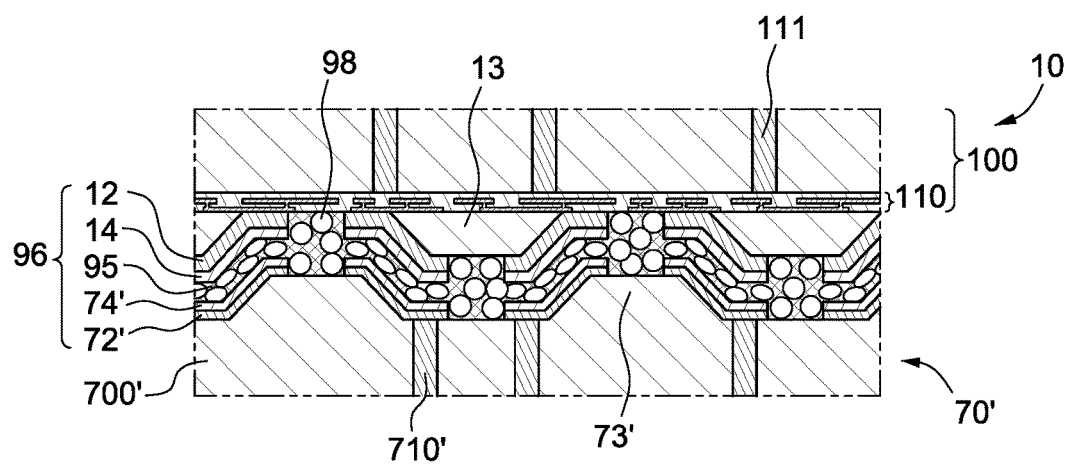
FIG. 9 illustrates interconnection structures between two semiconductor devices according to some embodiments of the present disclosure.

FIG. 9 illustrates interconnection structures 96 between two semiconductor devices 10 and 70' according to some embodiments of the present disclosure. The arrangement shown in FIG. 9 is similar to that of FIG. 8. A difference between the arrangements of FIGS. 8 and 9 is that a gap between the two semiconductor devices 10 and 70' is occupied by a bonding layer 95. A material of the bonding layer 95 may be an ACP, an ACA or an ACF, which includes conductive particles 98 each encapsulated with an isolating film. During a process of manufacturing, a first portion of the bonding layer 95 between the conductive layer 14 and the conductive layer 74' is compressed and squeezed so that the isolating films of the conductive particles 98 are ruptured. Therefore, the conductive particles 98 contact each other, which results in electrical connection between the conductive layer 14 and the conductive layer 74'. That is, the seed layer 12, the first conductive layer 14, the first portion of the bonding layer 95, the conductive layer 74' and the seed layer 72' form the interconnection structure 96. In addition, a second portion of the bonding layer 95 between the first columnar portion 13 and the main body 700' and between the columnar portion 73' and the first main body 100 are not compressed; thus, the isolating film remains on the conductive particles 98, which results in electrical isolation between the interconnection structures 96.

Figure 10A:
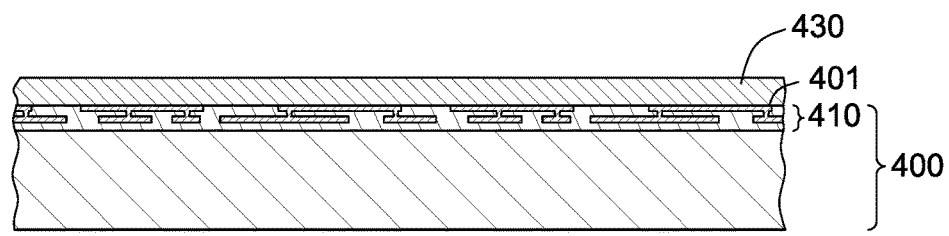
FIG. 10A, FIG. 10B, FIG. 10C, FIG. 10D and FIG. 10E illustrate a semiconductor process according to some embodiments of the present disclosure.

FIGS. 10A-10E illustrate a semiconductor process according to some embodiments of the present disclosure. In the illustrated embodiments, the semiconductor process is used to manufacture a semiconductor device such as the semiconductor device 40 as shown in FIG. 1. Referring to FIG. 10A, a main body 400 is provided. The main body 400 is a functional wafer, and has a first surface 401 and a first conductive element 410. The first conductive element 410 is disposed within the main body 400 and is exposed from the first surface 401. The first conductive element 410 may include at least one redistribution layer (RDL). Then, a passivation layer 430 (or other insulation layer) is formed on the first surface 401 of the main body 400. A material of the passivation layer 430 may be organic or inorganic, and is different from a material of the main body 400.

Figure 10B:
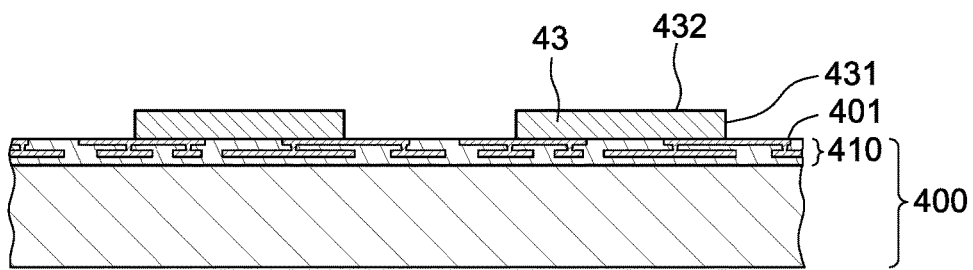

Referring to FIG. 10B, the passivation layer 430 is patterned by, for example, lithography or dry etching, so as to form a plurality of first columnar portions 43 and expose a portion of the first surface 401 (and a portion of the first conductive element 410). Each of the first columnar portions 43 protrudes from the first surface 401, and has a side surface 431 and a top surface 432.

Figure 10C:
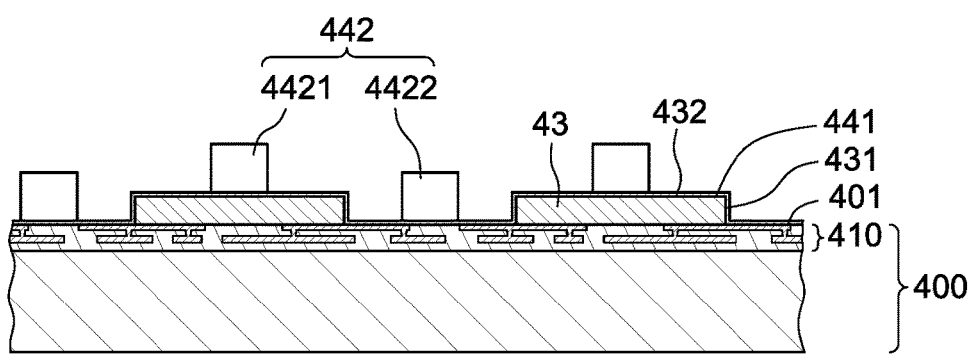

Referring to FIG. 10C, a seed layer 441 is formed on the side surfaces 431 and the top surfaces 432 of the first columnar portions 43 and the exposed portion of the first surface 401 (and the exposed portion of the first conductive element 410). Then, a patterned photoresist layer 442 is formed on the seed layer 441. A first portion 4421 of the patterned photoresist layer 442 is disposed on the seed layer 441 that is on the top surfaces 432 of the first columnar portions 43, and a second portion 4422 of the patterned photoresist layer 442 is disposed on the seed layer 441 that is on the first surface 401 (and the first conductive element 410). The first portion 4421 of the patterned photoresist layer 442 is discontinuous to the second portion 4422 of the patterned photoresist layer 442.

Figure 10D:
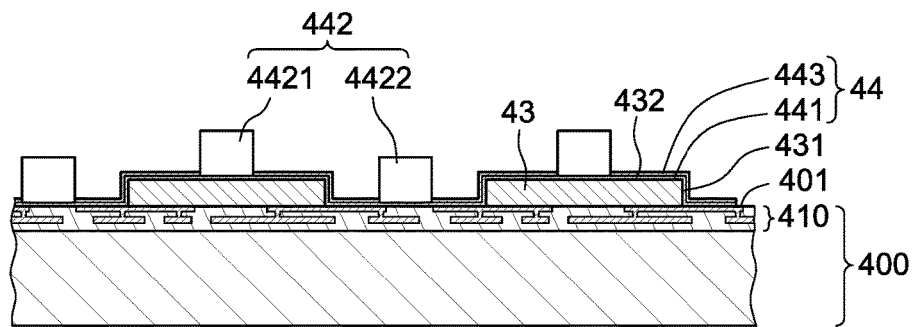

Referring to FIG. 10D, a first metal layer 443 is formed (e.g., plated) on the seed layer 441 that is not covered by the patterned photoresist layer 442 (between the first portion 4421 and the second portion 4422).

Figure 10E:
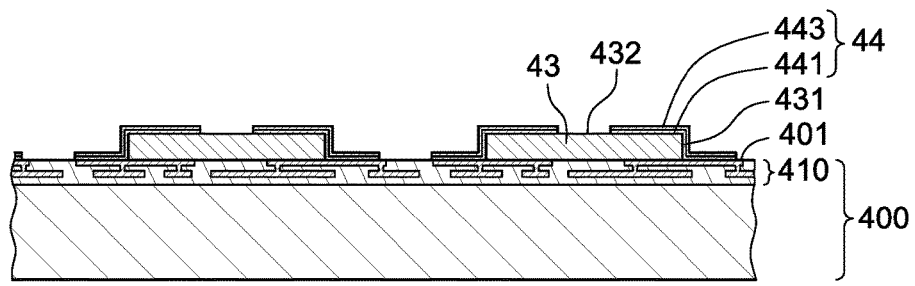

Referring to FIG. 10E, the patterned photoresist layer 442 is removed by stripping. Then, the seed layer 441 that is not covered by the first metal layer 443 is etched away, so as to form a plurality of first conductive layers 44 that are electrically isolated from each other. Each of the first conductive layers 44 electrically connects or physically contacts the first conductive element 410. Each first conductive layer 44 is disposed on the side surface 431 and the top surface 432 of the corresponding first columnar portion 43, and on the first surface 401 of the main body 400. Then, the main body 400 is cut or divided so as to obtain the semiconductor device 40 of FIG. 1.

Figure 11A:
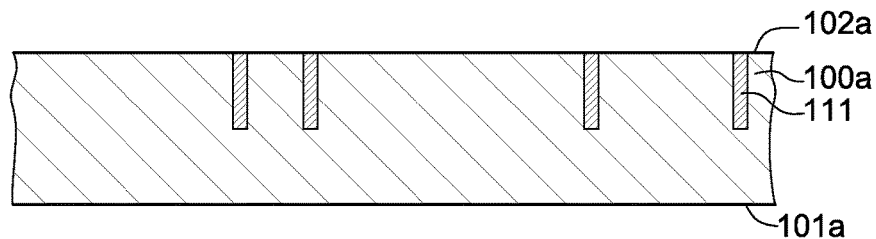
FIG. 11A, FIG. 11B, FIG. 11C, FIG. 11D, FIG. 11E and FIG. 11F illustrate a semiconductor process according to some embodiments of the present disclosure.

FIGS. 11A-11F illustrate a semiconductor process according to some embodiments of the present disclosure. In the illustrated embodiments, the semiconductor process is used to manufacture a semiconductor device such as the semiconductor device 10 as shown in FIGS. 1 and 2A. Referring to FIG. 11A, a base material 100a is provided. A material of the base material 100a is, for example, silicon. The base material 100a has a top surface 102a and a bottom surface 101a. Then, a plurality of vias 111 are formed on the top surface 102a. It is noted that the vias 111 do not penetrate through the base material 100a.

Figure 11B:
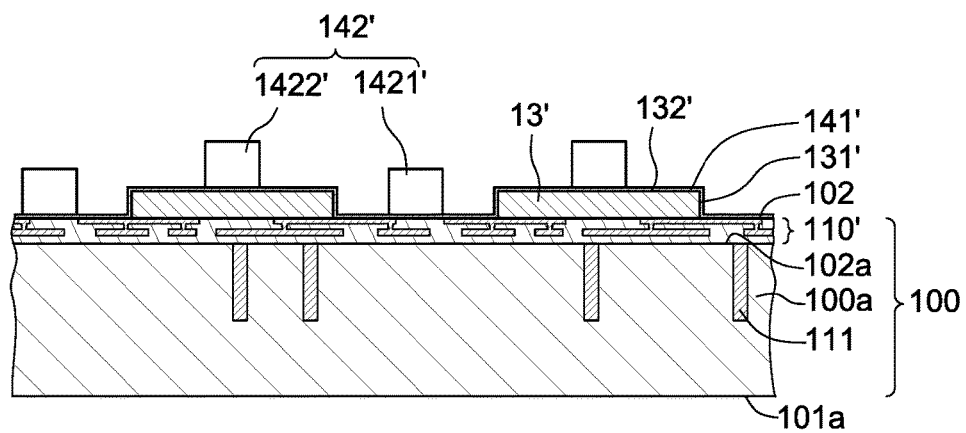

Referring to FIG. 11B, a second conductive element 110' is formed on the top surface 102a of the base material 100a to cover and electrically connect with the vias 111. Meanwhile, the second conductive element 110' and the base material 100a form the first main body 100. The first main body 100 has a second surface 102. That is, the second conductive element 110' is within the first main body 100 and is exposed from the second surface 102. The second conductive element 110' may include at least one redistribution layer (RDL) and/or the vias 111. Then, a plurality of first top columnar portions 13' are formed on the second surface 102. Each of the first top columnar portions 13' protrudes from the second surface 102, and has a side surface 131' and a top surface 132'.

Then, a seed layer 141' is formed on the side surfaces 131' and the top surfaces 132' of the first top columnar portions 13', and on a portion of the second surface 102 (and on a portion of the second conductive element 110'). Then, a patterned photoresist layer 142' is formed on the seed layer 141'. A first portion 1422' of the patterned photoresist layer 142' is disposed on the seed layer 141' that is on the top surfaces 132' of the first top columnar portions 13', and a second portion 1421' of the patterned photoresist layer 142' is disposed on the seed layer 141' that is on the second surface 102 (and the second conductive element 110'). The first portion 1422' of the patterned photoresist layer 142' is discontinuous to the second portion 1421' of the patterned photoresist layer 142'.

Figure 11C:
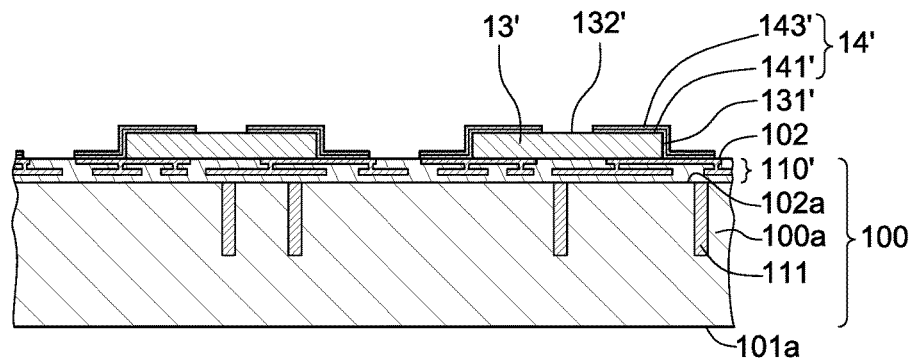

Referring to FIG. 11C, a metal layer 143' is formed (e.g., plated) on the seed layer 141' that is not covered by the patterned photoresist layer 142' (between the first portion 1422' and the second portion 1421'). Then, the patterned photoresist layer 142' is removed by stripping. Then, the seed layer 141' that is not covered by the metal layer 143' is etched away, so as to form a plurality of first top conductive layers 14' that are electrically isolated from each other. Each of the first top conductive layers 14' electrically connects or physically contacts the second conductive element 110'. Each first top conductive layer 14' is disposed on the side surface 131' and the top surface 132' of the corresponding first top columnar portion 13' and on the second surface 102 of the first main body 100.

Figure 11D:
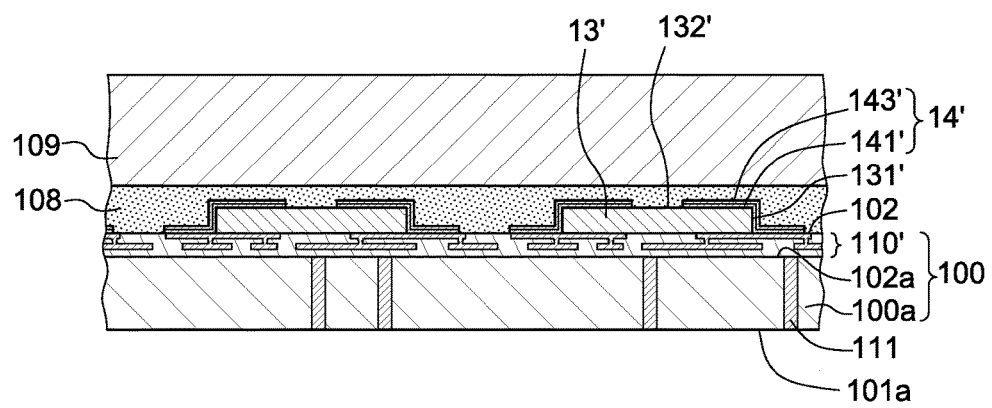

Referring to FIG. 11D, the second surface 102 of the first main body 100 and the first top columnar portions 13' are attached to a carrier 109 by an adhesive layer 108. Then, the first main body 100 is thinned from the bottom surface 101a of the base material 100a to expose the vias 111.

Figure 11E:
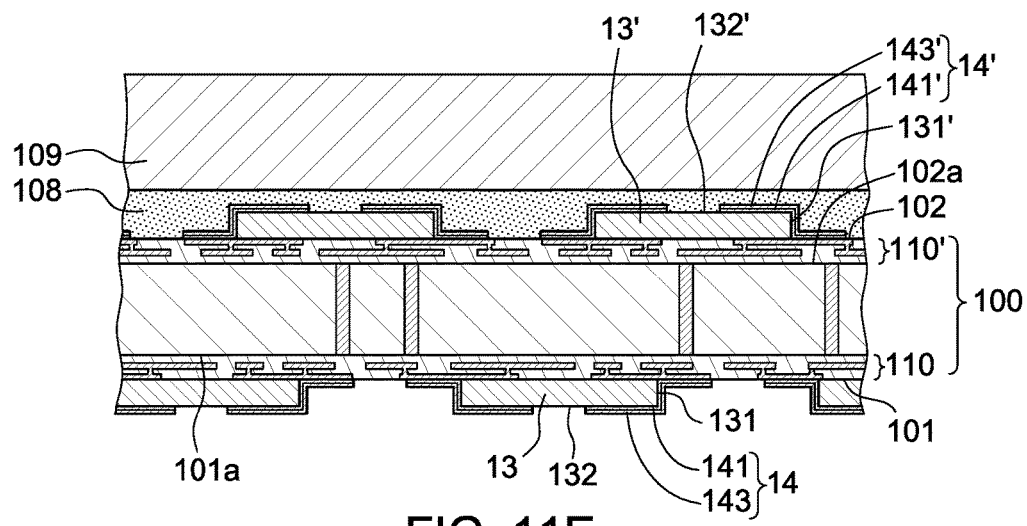

Referring to FIG. 11E, the first conductive element 110 is formed on the bottom surface 101a of the base material 100a to cover and electrically connect with the vias 111. Meanwhile, the first conductive element 110 is included in the first main body 100. The first main body 100 has a first surface 101. That is, the first conductive element 110 is exposed from the first surface 101. The first conductive element 110 may include at least one redistribution layer (RDL) and/or the vias 111. Then, a plurality of first columnar portions 13 are formed on the first surface 101. Each of the first columnar portions 13 protrudes from the first surface 101, and has a side surface 131 and a top surface 132. Then, the first conductive layers 14 are formed on the side surface 131 and the top surface 132 of each of the first columnar portions 13. Each of the first conductive layers 14 includes a seed layer 141 and a metal layer 143.

Figure 11F:
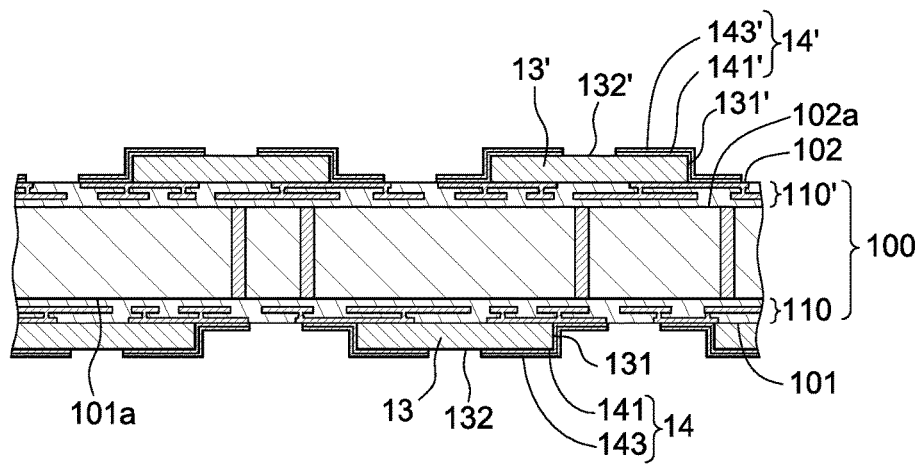

Referring to FIG. 11F, the second surface 102 of the first main body 100 and the first top columnar portions 13' are separated from the carrier 109. Then, the first main body 100 is cut so as to obtain the first semiconductor device 10 of FIGS. 1 and 2A.

It is noted that the second semiconductor device 20 (FIGS. 1 and 2A) may be further provided. The second semiconductor device 20 includes a second main body 200, at least one second columnar portion 23 and at least one second conductive layer 24. The second columnar portion 23 protrudes from a second surface 202. The second columnar portion 23 has a side surface 231 and a top surface 232. The second conductive layer 24 is disposed on the top surface 232 and the side surface 231 of the second columnar portion 23. Then, the first semiconductor device 10 is attached to the second semiconductor device 20, wherein the first conductive layer 14 is electrically coupled to the corresponding second conductive layer 24.

Figure 12A:
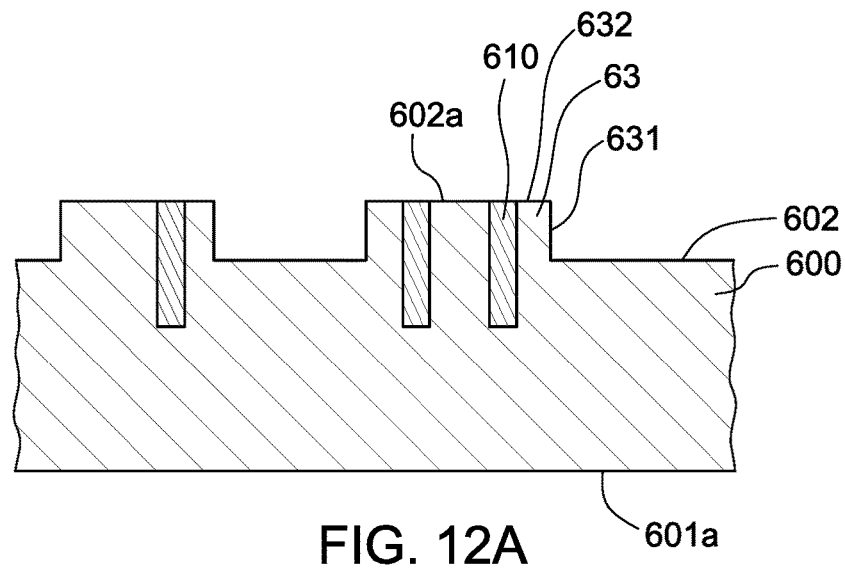
FIG. 12A, FIG. 12B, FIG. 12C, FIG. 12D, FIG. 12E and FIG. 12F illustrate a semiconductor process for manufacturing the interposer of FIG. 6 according to some embodiments of the present disclosure.

FIGS. 12A-12F illustrate a semiconductor process according to some embodiments of the present disclosure. In the illustrated embodiments, the semiconductor process is used to manufacture a semiconductor device such as the interposer 60' as shown in FIG. 6. Referring to FIG. 12A, a main body 600 is provided. A material of the main body 600 is, for example, silicon. The main body 600 has a top surface 602a and a bottom surface 601a. Then, a portion of the main body 600 is removed from the top surface 602a to form the second columnar portion 63 and a second surface 602. The second columnar portion 63 protrudes from the second surface 602. Meanwhile, the second columnar portion 63 includes a top surface 632 and a side surface 631, wherein the top surface 632 is a remaining portion of the top surface 602a. Then, at least one conductive element 610 (such as a via) is formed from the top surface 632, 602a and/or the second surface 602. The conductive element 610 extends from the top surface 632, 602a and/or the second surface 602 to a certain depth but does not penetrate through the main body 600.

Figure 12B:
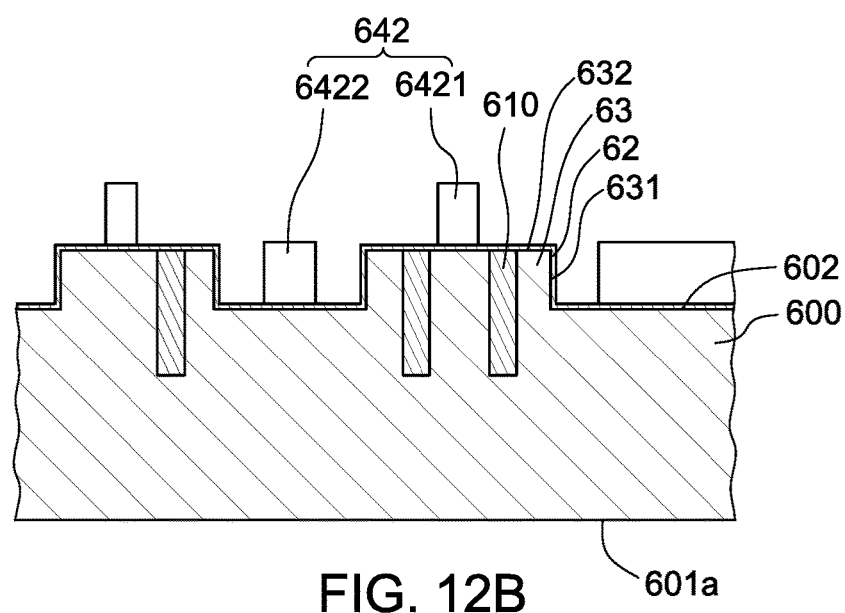

Referring to FIG. 12B, a seed layer 62 is formed on the top surfaces 632 and side surfaces 631 of the second columnar portions 63, Then, a patterned photoresist layer 642 is formed on the seed layer 62. A first portion 6421 of the patterned photoresist layer 642 is disposed on the seed layer 62 that is on the top surfaces 632 of the second columnar portions 63, and a second portion 6422 of the patterned photoresist layer 642 is disposed on the seed layer 62 that is on the second surface 602. The first portion 6421 of the patterned photoresist layer 642 is discontinuous with the second portion 6422 of the patterned photoresist layer 642.

Figure 12C:
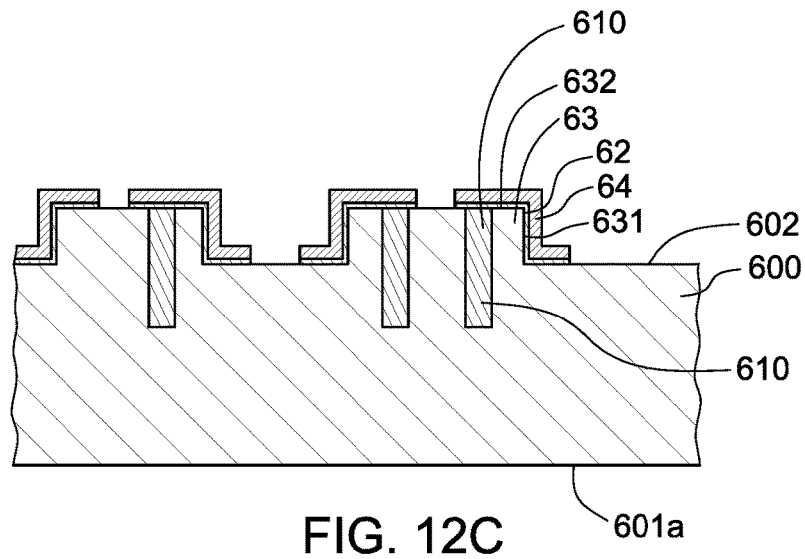

Referring to FIG. 12C, a plurality of conductive layers 64 are formed on the seed layer 62 that is not covered by the patterned photoresist layer 642 (between the first portion 6421 and the second portion 6422). Then, the patterned photoresist layer 642 is removed by stripping. Then, the seed layer 62 that is not covered by the conductive layers 64 is etched away. It is noted that the seed layer 62 may be included in the conductive layers 64 that are electrically isolated from each other. Each of the conductive layers 64 electrically connects or physically contacts the conductive element 610. Each conductive layer 64 is disposed on the side surface 631 and the top surface 632 of the corresponding second columnar portion 63 and on the second surface 602 of the main body 600.

Figure 12D:
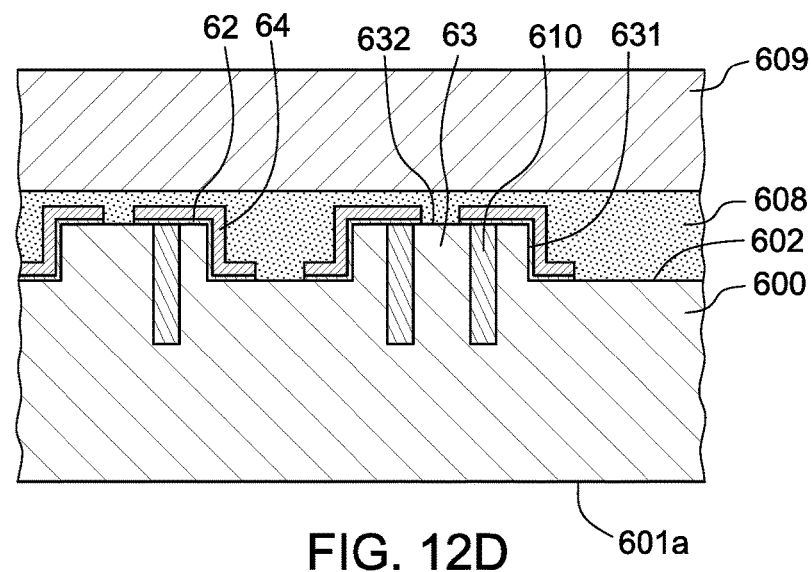

Referring to FIG. 12D, the second surface 602 of the main body 600 and the second columnar portions 63 are attached to a carrier 609 by an adhesive layer 608.

Figure 12E:
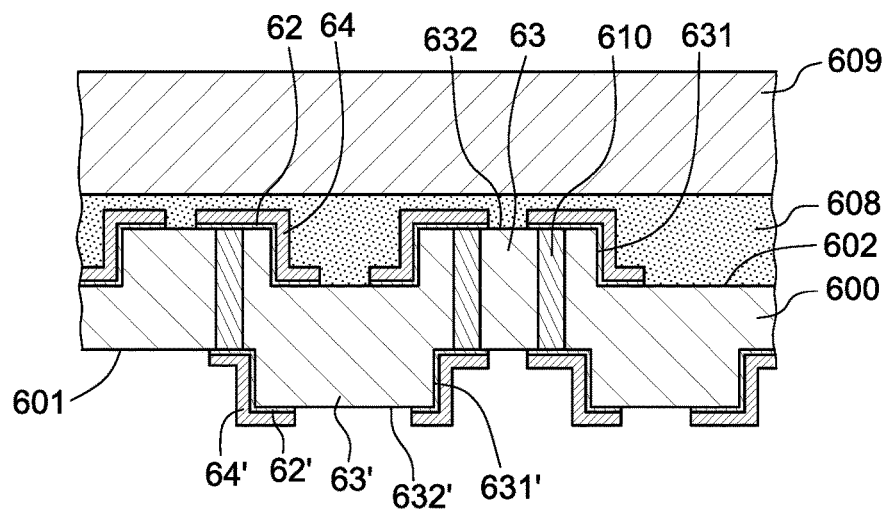

Referring to FIG. 12E, a portion of the main body 600 is removed from the bottom surface 601a of the main body 600 to expose the conductive element 610. Meanwhile, the first surface 601 and the bottom columnar portion 63' are formed. The bottom columnar portion 63' protrudes from the first surface 601, and includes a top surface 632' and a side surface 631', wherein the top surface 632' is a remaining portion of the bottom surface 601a. Then, the seed layer 62' and the conductive layers 64' are formed on the side surfaces 631' and the top surface 632' of each of the bottom columnar portions 63'. The seed layer 62' may be included in the conductive layers 64'.

Figure 12F:
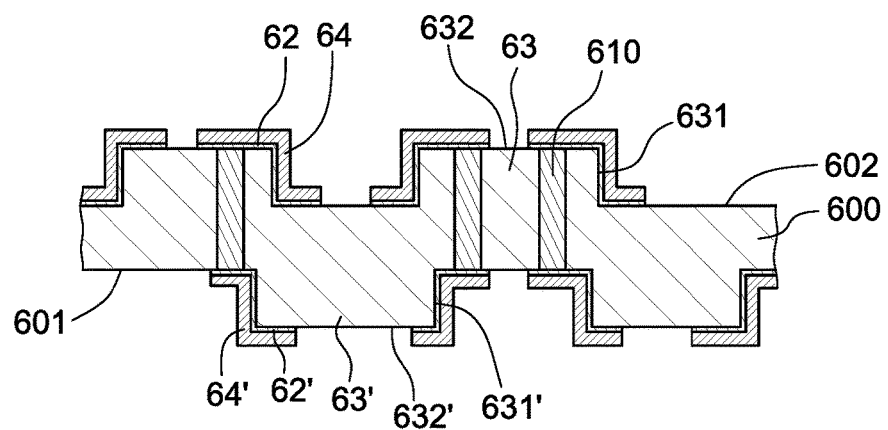

Referring to FIG. 12F, the second surface 602 of the main body 600 and the second columnar portions 63 are separated from the carrier 609. Then, the main body 600 is cut so as to obtain the interposer 60' of FIG. 6.

Figure 13A:
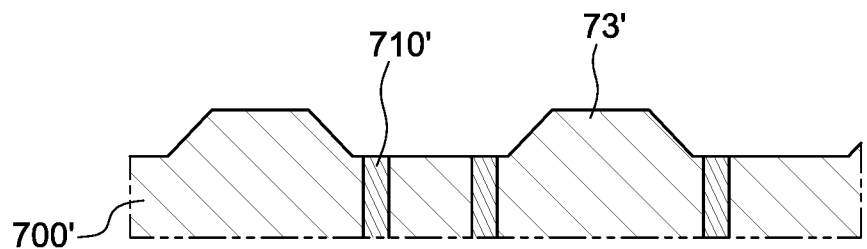
FIG. 13A, FIG. 13B, FIG. 13C, FIG. 13D, FIG. 13E and FIG. 13F illustrate a semiconductor process for forming solder joints between the two semiconductor devices of FIG. 7 according to some embodiments of the present disclosure.

FIGS. 13A-13F illustrate a semiconductor process for forming the interconnection structures 76 between the two semiconductor devices 70 and 70' of FIG. 7. Referring to FIG. 13A, a main body 700' is provided. Then, at least one columnar portion 73' is formed to protrude from a top surface of the main body 700'. The columnar portions 73' are tapered in shape. In other embodiments, another columnar body may be used as the columnar portions 73'. Then, at least one via 710' is formed to penetrate through the main body 700'.

Figure 13B:
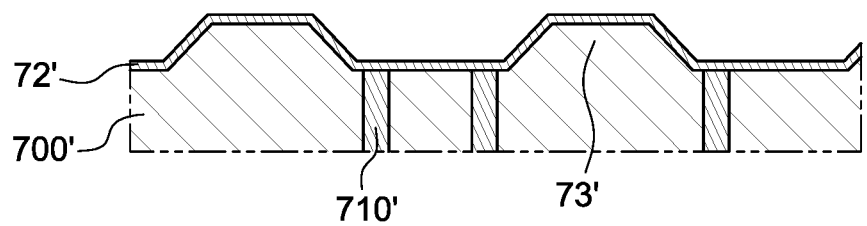

Referring to FIG. 13B, a seed layer 72' is formed (e.g., by physical vapor deposition (PVD) process) to cover the columnar portions 73' and the top surface of the main body 700'.

Figure 13C:
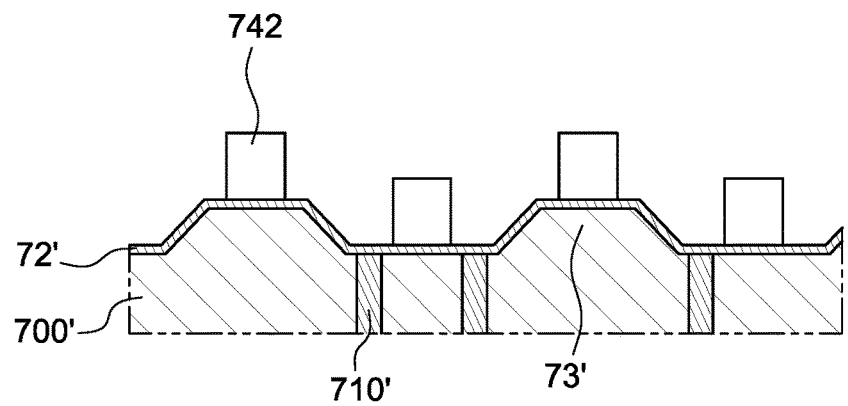

Referring to FIG. 13C, a patterned photoresist layer 742 is formed on the seed layer 72', wherein the patterned photoresist layer 742 is used as a mask for defining regions that a conductive layer 74' and a bonding layer 751 will be subsequently formed thereon.

Figure 13D:
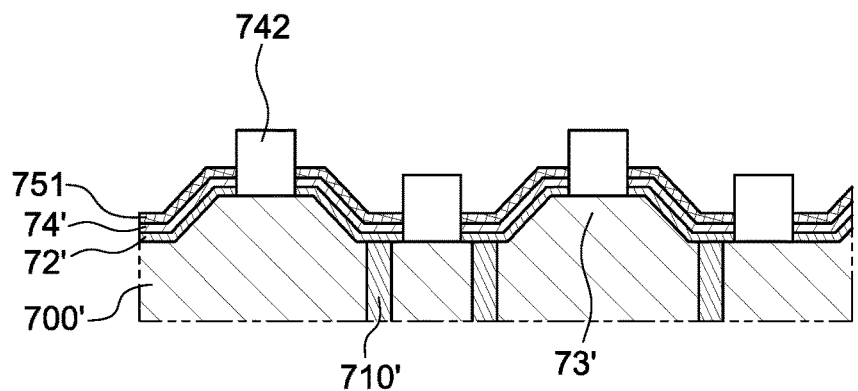

Referring to FIG. 13D, the conductive layer 74' is formed on the seed layer 72', and the bonding layer 751 is formed on the conductive layer 74'.

Figure 13E:
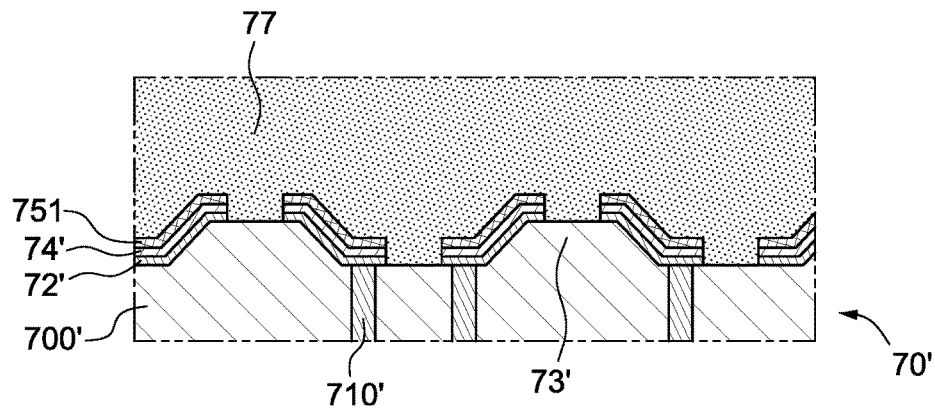

Referring to FIG. 13E, the patterned photoresist layer 742 is removed so as to obtain the semiconductor device 70'. Then, the isolation elements 77 are applied on the semiconductor device 70'. As shown in FIG. 13E, the isolation elements 77 are applied on the bonding layer 751 and on a portion of the top surface of the main body 700'.

Figure 13F:
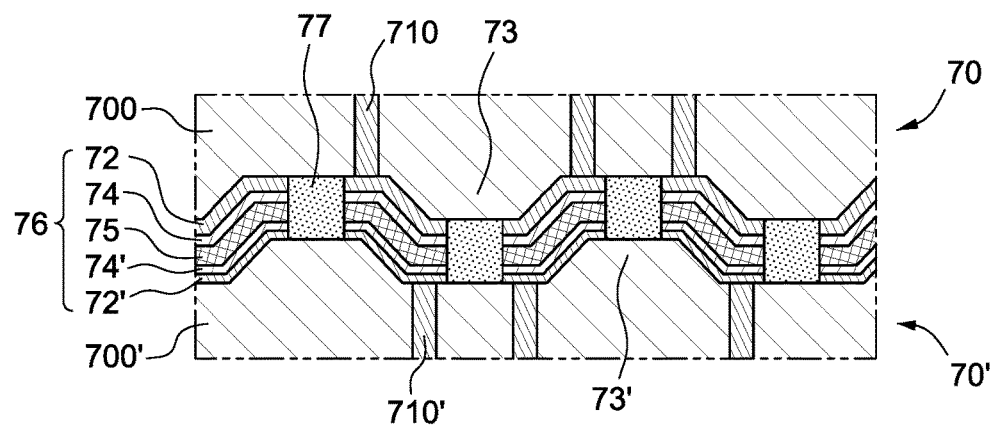

Referring to FIG. 13F, the semiconductor device 70' is bonded with a semiconductor device 70 similar to the semiconductor device 70'. The semiconductor device 70 includes a main body 700, columnar portions 73, vias 710 and a bonding layer. Each of the columnar portions 73 protrudes from the main body 700, and is tapered in shape. A seed layer 72 is formed on side surfaces and top surfaces of the columnar portions 73 and a bottom surface of the main body 700 of the semiconductor device 70. A conductive layer 74 is formed on the seed layer 72. The vias 710 penetrate through the main body 700 of the semiconductor device 70 and are electrically connected to the seed layer 72. The conductive layer 74 is disposed on the seed layer 72. The bonding layer is disposed on the conductive layer 74. It is noted that the bonding layer of the semiconductor device 70 and the bonding layer 751 of the semiconductor device 70' are fused together to form the bonding layer 75. As shown in FIG. 13F, the vias 710 are electrically connected with the vias 710' through the seed layer 72, the conductive layer 74, the bonding layer 75, the conductive layer 74' and the seed layer 72'. In addition, the seed layer 72, the conductive layer 74, the bonding layer 75, the conductive layer 74' and the seed layer 72' jointly form the interconnection structure 76. The isolation elements 77 may be disposed between the interconnection structures 76. In other words, the interconnection structures 76 are isolated from each other by the isolation elements 77.

Figure 14A:
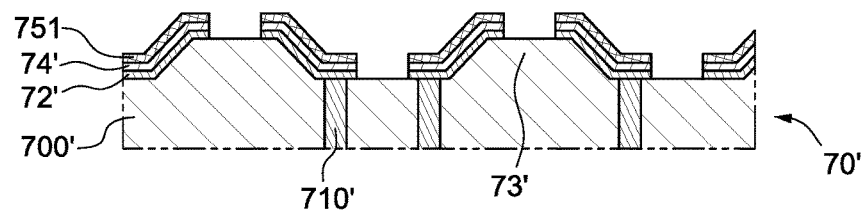
FIG. 14A, FIG. 14B and FIG. 14C illustrate a semiconductor process for forming solder joints between the two semiconductor devices of FIG. 8 according to some embodiments of the present disclosure.
Figure 14B:
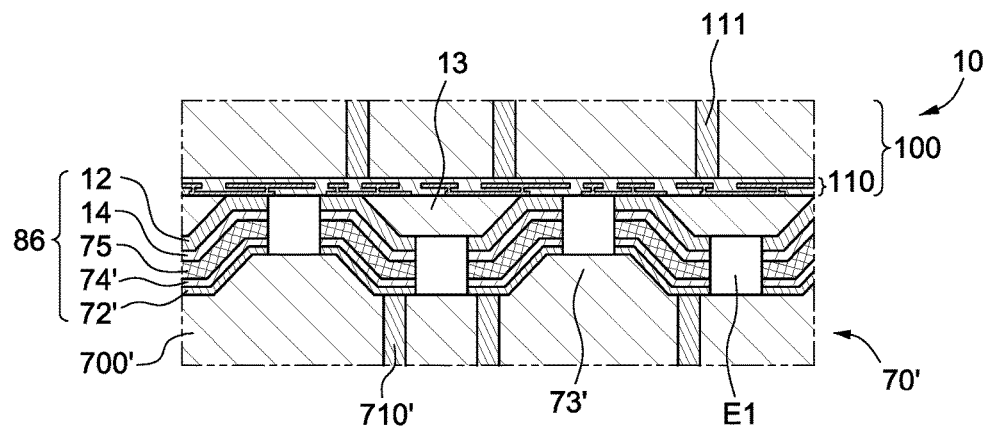
Figure 14C:
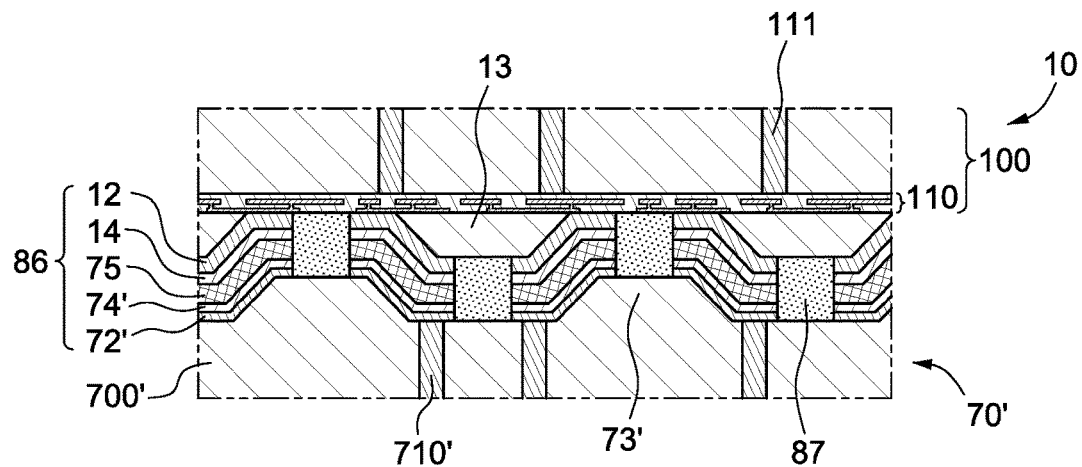

FIGS. 14A-14C illustrate a semiconductor process for forming the interconnection structures 86 between the two semiconductor devices 10 and 70' of FIG. 8. The initial stages of the illustrated process are the same as the stages illustrated in FIGS. 13A to 13D. FIG. 14A is subsequent to FIG. 13D. Referring to FIG. 14A, the patterned photoresist layer 742 is removed so as to obtain the semiconductor device 70'.

Referring to FIG. 14B, the semiconductor device 70' is bonded with a semiconductor device 10 of FIG. 8. The semiconductor device 10 of FIG. 8 is similar to the semiconductor device 10 of FIG. 1, except that the columnar portion 13 is tapered in shape (e.g., a trapezoidal shape) and the seed layer 12 is disposed between the conductive layer 14 and the columnar portion 13, and between the conductive layer 14 and the main body 100. It is noted that a bonding layer on the conductive layer 14 of the semiconductor device 10 and the bonding layer 751 of the semiconductor device 70' are fused together to form the bonding layer 75. After bonding, the seed layer 12, the conductive layer 14, the bonding layer 75, the conductive layer 74' and the seed layer 72' jointly form the interconnection structure 86. As shown in FIG. 14B, a plurality of empty spaces E1 are formed between the semiconductor devices 10 and 70' and are disposed between the interconnection structures 86.

Referring to FIG. 14C, the empty spaces E1 are filled with a CUF to form the isolation elements 87. In other words, the interconnection structures 86 are isolated from each other by the isolation elements 87.

Figure 15A:
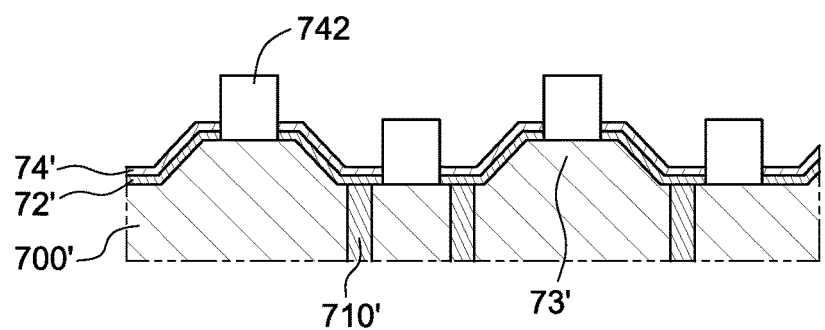
FIG. 15A, FIG. 15B and FIG. 15C illustrate a semiconductor process for forming conductive particle joints between the two semiconductor devices of FIG. 9 according to some embodiments of the present disclosure.
Figure 15B:
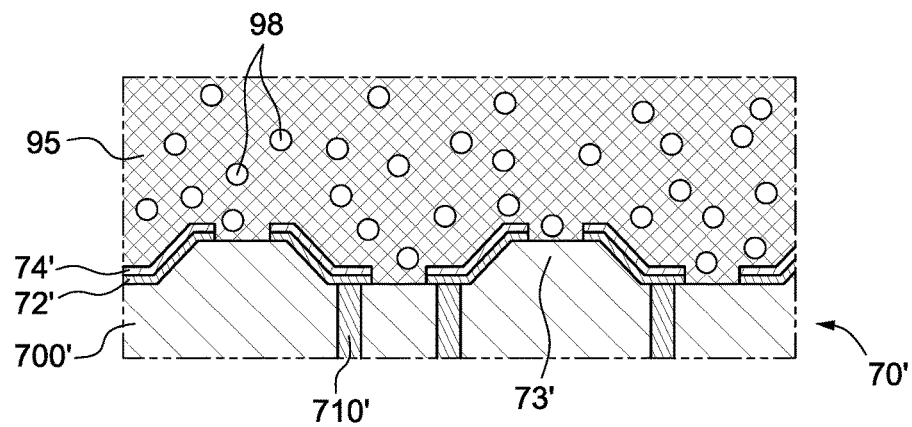
Figure 15C:
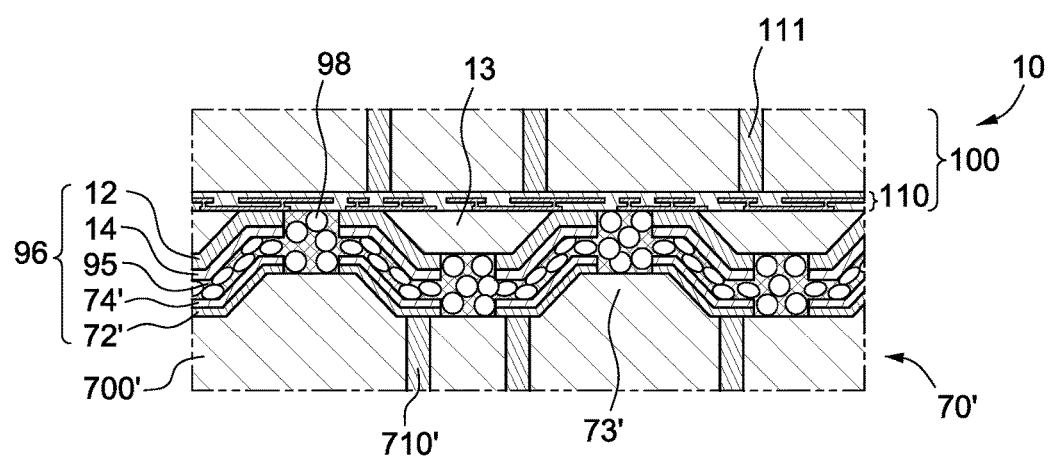

FIGS. 15A-15C illustrate a semiconductor process for forming the interconnection structures 96 between the semiconductor devices 10 and 70' of FIG. 9. The initial stages of the illustrated process are the same as the stages illustrated in FIGS. 13A to 13C. FIG. 15A is subsequent to FIG. 13C. Referring to FIG. 15A, the conductive layer 74' is formed on the seed layer 72'. It is noted that, in the illustrated embodiments, there is no bonding layer 751 (FIG. 13D) formed on the conductive layer 74'.

Referring to FIG. 15B, the patterned photoresist layer 742 is removed so as to obtain the semiconductor device 70'. Then, the bonding layer 95 is applied on the semiconductor device 70'. As shown in FIG. 15B, the bonding layer 95 is applied to cover the conductive layer 74', the top surface of the semiconductor device 70' and the top surface of the columnar portion 73'. For example, a material of the bonding layer 95 may be an ACF, an ACA, an ACP or the like. In some embodiments of the subject disclosure, the material of the bonding layer 95 is a mixture of an isolating material and a plurality of conductive particles 98. The conductive particles 98 each is encapsulated with an isolating film.

Referring to FIG. 15C, the semiconductor device 10 of FIG. 14B is provided to compress and squeeze the bonding layer 95 on the semiconductor device 70'. During the process, a distance between the conductive layer 14 and the conductive layer 74' in a vertical direction is controlled (e.g., the distance is controlled to be less than the particle diameter (s) of the conductive particles 98) so that the conductive particles 98 sandwiched between the conductive layer 14 and the conductive layer 74' are compressed to be ruptured, and that the conductive particles 98, which are not sandwiched between the conductive layer 14 and the conductive layer 74' (e.g., the conductive particles 98 sandwiched between the columnar portion 13 and a top surface of the semiconductor device 70' or between the columnar portion 73' and the conductive element 110), are not squeezed to be ruptured. After being compressed, the ruptured conductive particles 98 expose a conductive material and form electrical interconnections between the conductive layer 14 and conductive layer 74'. As shown in FIG. 15C, the seed layer 12, the conductive layer 14, the bonding layer 95 sandwiched between the conductive layer 14 and the conductive layer 74', the conductive layer 74' and the seed layer 72' jointly form the interconnection structure 96. The material of the bonding layer 95 sandwiched between the columnar portion 13 and the top surface of the semiconductor device 70' or between the columnar portion 73' and the conductive element 110 forms a plurality of isolation elements and divides the interconnection structures 96 into a plurality of segments that are isolated from each other.

According to some embodiments of the present disclosure, a semiconductor package having higher lateral stress tolerance and more compact sizes of interconnection structures is advantageously provided. In particular, as shown, for example, in FIGS. 1, 2A, 2B and 3, a tenon structure constituted by two laterally-contacted columnar portions may yield significant elimination of a tangential component (e.g., with respect to the first surface 101 of the first main body 100) of a thermal stress σ because of lateral support between the two laterally-contacted columnar portions. In addition, a bonding between the two laterally-contacted columnar portions may yield significant elimination of a normal component (e.g., with respect to the first surface 101 of the first main body 100) of the thermal stress σ. Furthermore, a lower first length $L_1$, compared with a structure using typical pillar or bump pads, may further restrict a warpage $W_1$.

As should be noted, compared with typical pillar or bump pads, the improved structure of embodiments of the present disclosure provides significant higher lateral stress tolerance and more compact sizes of pillars and/or bump pads. According to embodiments of the present disclosure, a semiconductor package having higher capability against warpage is advantageously provided.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such arrangement.

As used herein, the singular terms "a," "an," and "the" may include plural referents unless the context clearly dictates otherwise.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For another example, two numerical values can be deemed to be "substantially" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package, comprising:
   a first semiconductor device, comprising:
      a first main body having a bottom surface;
      at least one first columnar portion protruding from the bottom surface of the first main body; and
      at least two first conductive layers disposed on side surfaces of the first columnar portion, wherein the first conductive layers do not physically contact each other; and
   a second semiconductor device, comprising:
      a second main body having a top surface facing the bottom surface of the first main body;
      at least one second columnar portion protruding from the top surface of the second main body; and
      at least two second conductive layers disposed on side surfaces of the second columnar portion, wherein the second conductive layers do not physically contact each other;
   wherein the first conductive layers are electrically coupled to the second conductive layers.

2. The semiconductor package of claim 1, wherein the first columnar portion has a first height, the second columnar portion has a second height, and a sum of the first height and the second height is greater than a distance between the bottom surface of the first main body and the top surface of the second main body.

3. The semiconductor package of claim 1, wherein a material of the first columnar portion is the same as or different from a material of the first main body, and a material of the second columnar portion is the same as or different from a material of the second main body.

4. The semiconductor package of claim 1, wherein the first semiconductor device further comprises a first conductive element disposed on or exposed from the bottom surface of the first main body, at least one of the first conductive layers contacts the first conductive element, the second semiconductor device further comprises a second conductive element disposed on or exposed from the top surface of the second main body, and at least one of the second conductive layers contacts the second conductive element.

5. The semiconductor package of claim 1, wherein at least one of the first conductive layers extends to a bottom surface of the first columnar portion and the bottom surface of the first main body, and at least one of the second conductive layers extends to a top surface of the second columnar portion and the top surface of the second main body.

6. The semiconductor package of claim 1, further comprising a bonding material between at least one of the first conductive layers and at least one of the second conductive layers so as to form an interconnection structure.

7. The semiconductor package of claim 6, wherein the bonding material is an anisotropic conductive film, an anisotropic conductive adhesive, an anisotropic conductive paste or solder.

8. The semiconductor package of claim 6, further comprising an isolation material adjacent to the interconnection structure.

9. The semiconductor package of claim 1, wherein each of the first columnar portion and the second columnar portion is tapered in shape.

10. The semiconductor package of claim 1, further comprising a third semiconductor device below the second semiconductor device, wherein the third semiconductor device comprises:
- a third main body having a top surface;
- at least one third columnar portion protruding from the top surface of the third main body; and
- at least one third conductive layer disposed on a side surface of the third columnar portion;
- wherein the second main body further has a bottom surface facing the top surface of the third main body, the second semiconductor device further comprises at least one bottom columnar portion protruding from the bottom surface of the second main body, and at least one bottom conductive layer disposed on a side surface of the bottom columnar portion, wherein the bottom conductive layer is electrically coupled to the third conductive layer.

11. The semiconductor package of claim 1, wherein a thermal stress σ at a corner between the first main body and the first columnar portion is expressed as:

$$\sigma = (\alpha_T - \alpha_B)\Delta T\, E_T E_B\, A_T/(E_T A_T + E_B A_B),$$

wherein $\alpha_T$ and $\alpha_B$ are coefficients of thermal expansion (CTE) for the first columnar portion and the first conductive layers, respectively, wherein $E_T$ and $E_B$ are coefficients of Young's modulus for the first columnar portion and the first conductive layers, respectively, wherein $\Delta T$ is a temperature difference between a temperature before the semiconductor package being heated and a temperature after the semiconductor package being heated, and wherein $A_T$ and $A_B$ are cross-sectional areas of the first columnar portion and the first conductive layers, respectively, in the semiconductor package along a vertical direction.

12. The semiconductor package of claim 11, wherein a tangent component ($\sigma_T$) and a normal component ($\sigma_N$) of the thermal stress (σ) satisfy the following:

$$K_t \sigma_T = K_t\, \sigma \sin\theta \le S_T, \text{ and}$$

$$\sigma_N = \sigma \cos\theta \le S_B;$$

where $K_t$ is a stress concentration factor at the corner between the first main body and the first columnar portion, and $S_T$ is a material strength of the first columnar portion.

13. The semiconductor package of claim 12, wherein the first main body has a first length $L_1$, at least one of the first conductive layers has a material strength $S_B$, and a warpage $W_1$ of the first main body satisfies at least one of the following equations:

$$W_1 \le (L_1/2)\cdot\sin\,[S_T/(K_t\sigma)];\text{ or}$$

$$W_1 \le (L_1/2)\cdot\sin\,[\cos^{-1}(S_B/\sigma)].$$

14. The semiconductor package of claim 1, wherein a thermal stress σ at a corner between the second main body and the second columnar portion is expressed as:

$$\sigma = (\alpha_T - \alpha_B)\Delta T\, E_T E_B\, A_T/(E_T A_T + E_B A_B),$$

wherein $\alpha_T$ and $\alpha_B$ are coefficients of thermal expansion (CTE) for the second columnar portion and the second conductive layers, respectively, wherein $E_T$ and $E_B$ are coefficients of Young's modulus for the second columnar portion and the second conductive layers, respectively, wherein $\Delta T$ is a temperature difference between a temperature before the semiconductor package being heated and a temperature after the semiconductor package being heated, and wherein $A_T$ and $A_B$ are cross-sectional areas of the second columnar portion and the second conductive layers, respectively, in the semiconductor package along a vertical direction.

15. The semiconductor package of claim 14, wherein a tangent component ($\sigma_T$) and a normal component ($\sigma_N$) of the thermal stress (σ) satisfy the following:

$$K_t \sigma_T = K_t \sigma \sin\theta \le S_T, \text{ and}$$

$$\sigma_N = \sigma \cos\theta \le S_B;$$

where $K_t$ is a stress concentration factor at the corner between the second main body and the second columnar portion, and $S_T$ is a material strength of the second columnar portion.

16. The semiconductor package of claim 15, wherein the second main body has a second length $L_2$, at least one of the second conductive layers has a material strength $S_B$, and a warpage $W_2$ of the second main body satisfies at least one of the following equations:

$$W_2 \le (L_2/2)\cdot\sin\,[S_T/(K_t\sigma)];\text{ or}$$

$$W_2 \le (L_2/2)\cdot\sin\,[\cos^{-1}(S_B/\sigma)].$$

17. An interposer, comprising:
- a main body having a first surface and a second surface opposite to the first surface;
- at least one conductive via disposed in the main body;
- at least one second columnar portion protruding from the second surface;
- at least one first columnar portion protruding from the first surface;
- at least one second conductive layer disposed on a side surface of the second columnar portion and electrically coupled to a second end of the conductive via; and
- at least one first conductive layer disposed on a side surface of the first columnar portion and electrically coupled to a first end of the conductive via;
- wherein the first columnar portion and second columnar portion are laterally offset from each other.

18. The interposer of claim 17, wherein a material of the first columnar portion is the same as a material of the main body.

19. The interposer of claim 17, wherein the main body has a length $L_2$, the second conductive layer has a material strength $S_B$, the second columnar portion has a material strength $S_T$, and a warpage $W_2$ of the main body satisfies at least one of the following equations:

$$W_2 \le (L_2/2)\cdot\sin\,[S_T/(K_t\sigma)];\text{ or}$$

$$W_2 \le (L_2/2)\cdot\sin\,[\cos^{-1}(S_B/\sigma)],$$

wherein $K_t$ is a stress concentration factor at a corner between the main body and the second columnar portion, and σ is a thermal stress at the corner;

wherein σ is expressed as:

$$\sigma = (\alpha_T - \alpha_B)\cdot\Delta T\cdot E_T\cdot E_B\cdot A_T/(E_T\cdot A_T + E_B\cdot A_B),$$

wherein $\alpha_T$ and $\alpha_B$ are coefficients of thermal expansion (CTE) for the second columnar portion and the second conductive layer, respectively, wherein $E_T$ and $E_B$ are coefficients of Young's modulus for the second columnar portion and the second conductive layer, respectively, wherein $\Delta T$ is a temperature difference between a temperature before the interposer being heated and a temperature after the interposer being heated, and wherein $A_T$ and $A_B$ are cross-sectional areas of the second columnar portion and the second conductive layer, respectively, in the interposer along a vertical direction.

20. The interposer of claim 17, wherein a material of the second columnar portion is the same as a material of the main body.

* * * * *